United States Patent
Yamazaki

(10) Patent No.: US 9,190,529 B2
(45) Date of Patent: Nov. 17, 2015

(54) THIN FILM TRANSISTOR HAVING FOUR DIFFERENT GATE ELECTRODES

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/554,208

(22) Filed: Nov. 26, 2014

(65) Prior Publication Data

US 2015/0155392 A1    Jun. 4, 2015

Related U.S. Application Data

(63) Continuation of application No. 14/074,230, filed on Nov. 7, 2013, now Pat. No. 8,901,558.

(30) Foreign Application Priority Data

Nov. 15, 2012    (JP) .................................. 2012-251701
Nov. 16, 2012    (JP) .................................. 2012-251860

(51) Int. Cl.
  *H01L 29/00*    (2006.01)
  *H01L 29/786*   (2006.01)
  (Continued)

(52) U.S. Cl.
  CPC .......... *H01L 29/78693* (2013.01); *H01L 27/12* (2013.01); *H01L 27/1214* (2013.01);
  (Continued)

(58) Field of Classification Search
  CPC ................ H01L 27/1214; H01L 27/12; H01L 29/78645; H01L 29/4908; H01L 29/78696; H01L 29/7869
  See application file for complete search history.

(56) References Cited

U.S. PATENT DOCUMENTS 4,466,081 A    8/1984    Masuoka
5,731,856 A    3/1998    Kim et al.
(Continued)

FOREIGN PATENT DOCUMENTS

EP    1737044 A    12/2006
EP    2226847 A    9/2010
(Continued)

OTHER PUBLICATIONS

Asakuma.N et al., "Crystallization and Reduction of Sol-Gel-Derived Zinc Oxide Films By Irradiation With Ultraviolet Lamp", Journal of Sol-Gel Science and Technology, 2003, vol. 26, pp. 181-184.
(Continued)

*Primary Examiner* — Ngan Ngo
(74) *Attorney, Agent, or Firm* — Fish & Richardson P.C.

(57) ABSTRACT

Provided is a transistor including an oxide semiconductor in a channel formation region in which the threshold voltage is controlled, which is a so-called normally-off switching element. The switching element includes a first insulating film, an oxide semiconductor layer over the first insulating film and includes a channel formation region, a second insulating film covering the oxide semiconductor layer, a source electrode layer and a drain electrode layer electrically connected to the oxide semiconductor layer. The semiconductor device further includes a first gate electrode layer overlapping the channel formation region with the first insulating film therebetween, a second gate electrode layer overlapping the channel formation region with the second insulating film therebetween, and a third gate electrode layer overlapping a side surface of the oxide semiconductor layer in a channel width direction with the second insulating film therebetween.

20 Claims, 23 Drawing Sheets

(51) Int. Cl.
*H01L 29/24* (2006.01)
*H01L 29/49* (2006.01)
*H01L 27/12* (2006.01)
*H01L 29/423* (2006.01)

(52) U.S. Cl.
CPC ........ *H01L29/247* (2013.01); *H01L 29/42384* (2013.01); *H01L 29/4908* (2013.01); *H01L 29/7869* (2013.01); *H01L 29/78645* (2013.01); *H01L 29/78648* (2013.01); *H01L 29/78696* (2013.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 7,884,360 | B2 | 2/2011 | Takechi et al. |
| 7,892,898 | B2 | 2/2011 | Oba |
| 7,994,579 | B2 | 8/2011 | Itai |
| 8,148,779 | B2 | 4/2012 | Jeong et al. |
| 8,203,143 | B2 | 6/2012 | Imai |
| 8,237,166 | B2 | 8/2012 | Kumomi et al. |
| 8,901,558 | B2 * | 12/2014 | Yamazaki ........................ 257/43 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0051940 | A1 * | 3/2010 | Yamazaki et al. ............... 257/43 |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0101351 | A1 | 5/2011 | Yamazaki |
| 2011/0136301 | A1 * | 6/2011 | Yamazaki et al. ............ 438/156 |
| 2012/0061662 | A1 * | 3/2012 | Yamazaki et al. ............... 257/43 |
| 2013/0056763 | A1 | 3/2013 | Koyama et al. |
| 2013/0140557 | A1 | 6/2013 | Miyairi et al. |
| 2013/0285050 | A1 | 10/2013 | Yamazaki et al. |
| 2014/0042437 | A1 | 2/2014 | Yamazaki |
| 2014/0091303 | A1 | 4/2014 | Yamazaki et al. |
| 2014/0110704 | A1 | 4/2014 | Yamazaki et al. |
| 2014/0110706 | A1 | 4/2014 | Yamazaki |
| 2014/0131702 | A1 | 5/2014 | Matsubayashi et al. |
| 2014/0151674 | A1 | 6/2014 | Yamazaki et al. |

FOREIGN PATENT DOCUMENTS

| | | |
|---|---|---|
| JP | 60-198861 A | 10/1985 |
| JP | 63-210023 A | 8/1988 |
| JP | 63-210024 A | 8/1988 |
| JP | 66-210022 A | 8/1988 |
| JP | 63-215519 A | 9/1988 |
| JP | 65-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| | | |
|---|---|---|
| JP | 2004-273732 A | 9/2004 |
| JP | 2011-181801 A | 9/2011 |
| WO | WO-2004/114391 | 12/2004 |

OTHER PUBLICATIONS

Asaoka.Y et al., "29:1 Polarizer-Free Reflective LCD Combined With Ultra Low-Power Driving Technology", SID Digest '09, SID International Symposium Digest of Technical Papers, May 31, 2009, pp. 395-398.

Chern.H et al., "An Analytical Model For The Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors For AMOLED Back-Plane", SID Digest '09, SID International Symposium Digest of Technical Papers, May 31, 2009, pp. 280-283.

Clark.S et al., "First Principles Methods Using CASTEP", Zeitschritt fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and its Blue Phase", Phys. Rev. A (Physical Review A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09, SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1 Invited Paper: Improved Amorphous In—Ga—Zn—O TFTS", SID Digest '08, SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "58.3:Invited Paper Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1285.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review B), Oct. 4, 2007, vol. 76, No. 16, pp. 165202-1-165202-22.

Janotti.A et al., "Oxygen Vacancies in ZnO", Appl. Phys. Lett (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Aeeay", SID Digest '08, SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2006, No. 2317, ECS.

Kimizuka.N et al., "Spinel, YbFe2O4, and Yb2Fe3O7 Types of Structures for Compounds in the In2O3 and SC2O3—A2O3—BO Systems [A: Fe, Ga, or Al, B: Mg, Mn, Fe, Ni, Cu, or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2006, vol. 43, No. 1, pp. 292-299.

Lany.S et al., "Dopability, Intrinsic Conductivity, and Nonstoichiometry of Transparent Conducting Oxides", Phys Rev Lett (Physical Review Letters), Jan. 26, 2007, vol. 98, pp. 045501-1-045501-4.

Lee.H et al., "Current Status of Challenges to and Perspective View of AM-OLED", IDW '06 Proceedings of the 13th International Display Workshops, Dec. 7, 2006, pp. 863-868.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-626.

Lee.M et al., "15.4 Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In, Ga: M=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Plase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 8th Interntional Display Workshops, Dec. 3, 2008, pp. 581-584.

(56) References Cited

OTHER PUBLICATIONS

Nakamura.M, "Synthesis of Homologous Compound with New Long-Period Structure", Nirim Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transprent Oxide Semiconductor", Science, May 23, 2003, vol. 300, No. 5623, pp. 1269-1272.

Nowatari.H et al., "60.2: Intermediate Connector with Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review B), 2008, vol. 77, pp. 245202-1-245202-6.

Oh.M et al., "Improving the Gate Stability of ZnO Thin-Film Transistors with Aluminum Oxide Dielectric Layers", J. Electrochem. Soc (Journal of the Electrochemical Society), 2008, vol. 155, No. 12, pp. H1009-H1014.

Ohara.H et al., "21.3.4.0 In. QVGA AMOLED Display Using In—Ga—Zn—Oxide TFTS with a Novel Passivation Layer", SID Digest '09, SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display with Driver Circuit Using Amorphous In—Ga—Zn—Oxide TFTS", IDW'09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

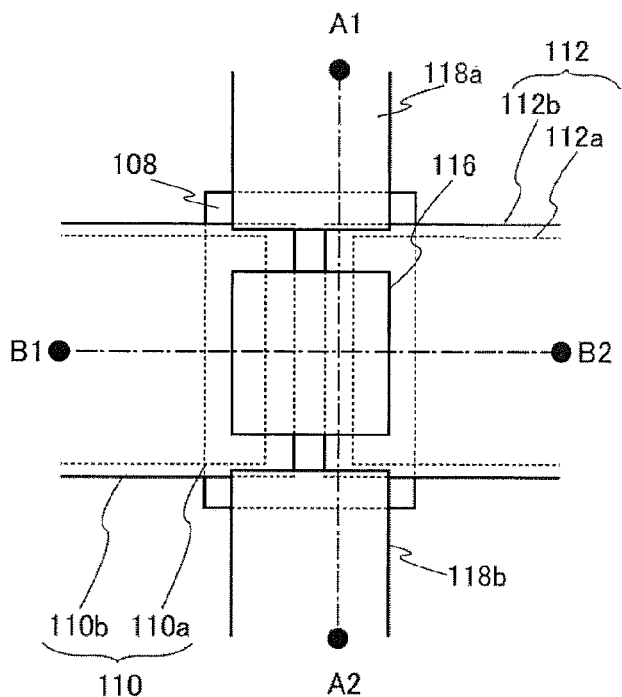
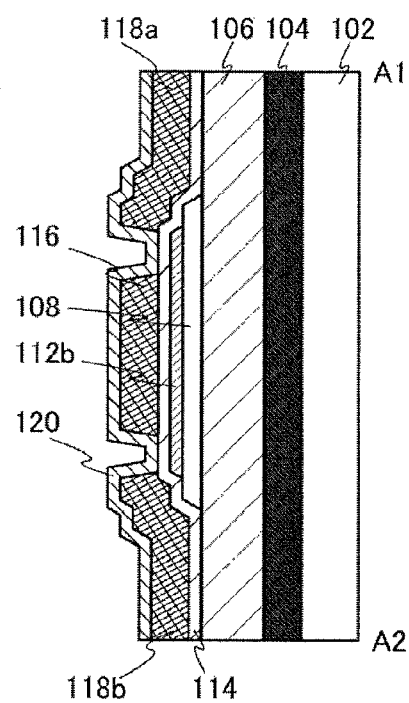
FIG. 1A
FIG. 1B
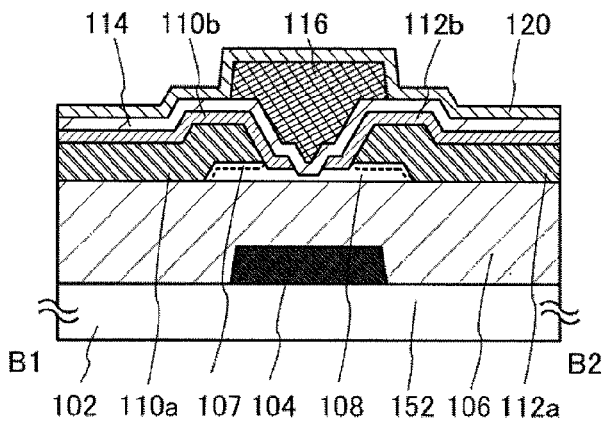
FIG. 1C

FIG. 11A
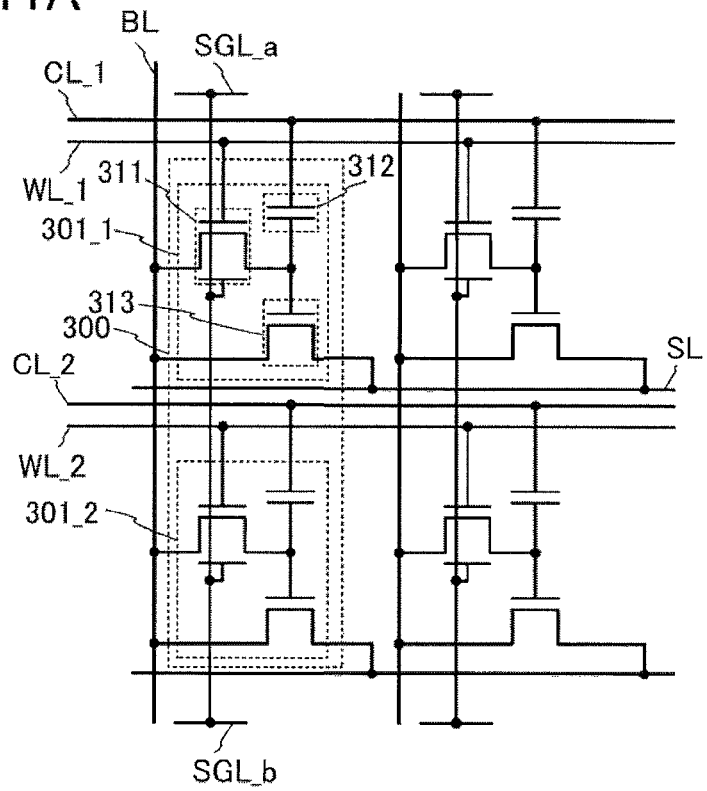
FIG. 11B Writing
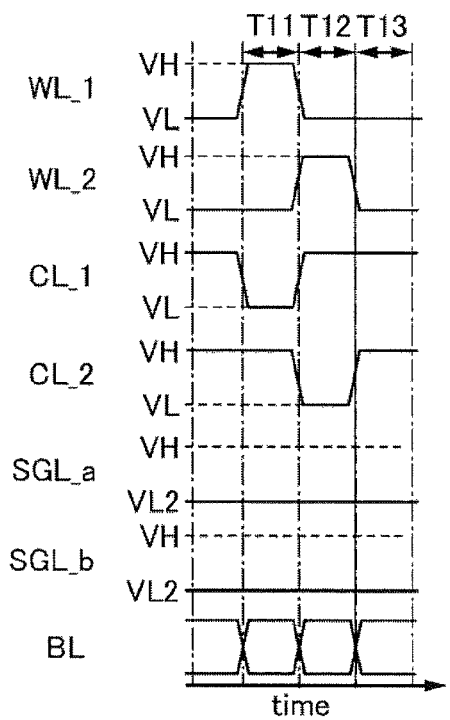
FIG. 11C Reading
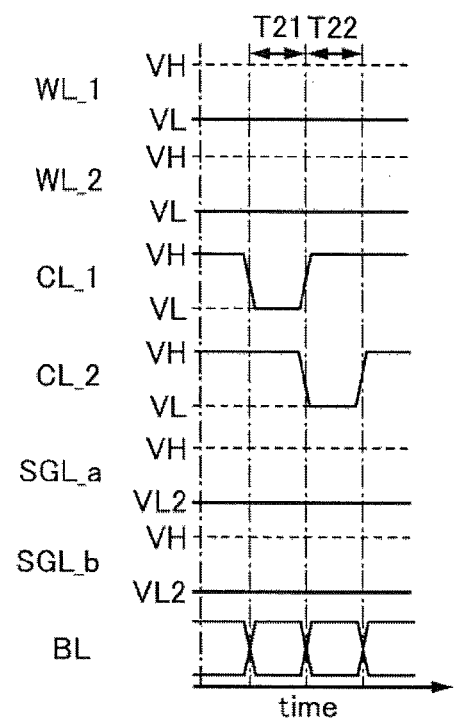

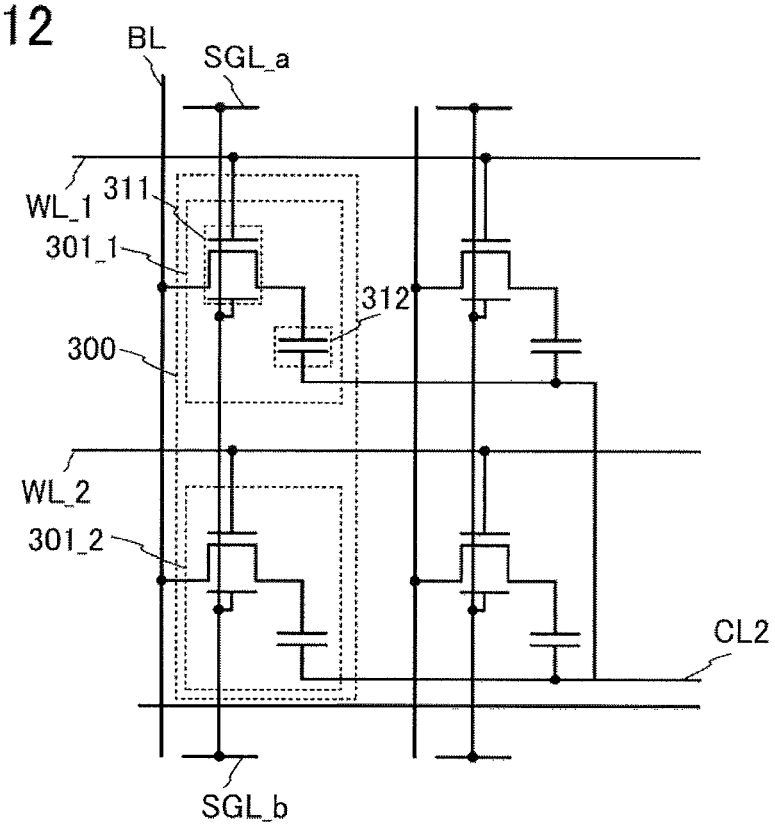

THIN FILM TRANSISTOR HAVING FOUR DIFFERENT GATE ELECTRODES

CROSS-REFERENCE TO RELATED APPLICATIONS

This application is a continuation of U.S. application Ser. No. 14/074,230, filed Nov. 7, 2013, now allowed, which claims the benefit of foreign priority applications filed in Japan as Serial No. 2012-251701 on Nov. 15, 2012, and Serial No. 2012-251860 on Nov. 16, 2012, all of which are incorporated by reference.

BACKGROUND OF THE INVENTION

1. Field of the Invention

The present invention relates to a semiconductor device, in particular, a semiconductor device including an oxide semiconductor layer.

It is to be noted that the semiconductor device in this specification refers to all devices that can function by utilizing semiconductor characteristics, and electro-optic devices, semiconductor circuits, and electronic appliances are all semiconductor devices.

2. Description of the Related Art

Attention has been focused on a technique for forming a transistor (also referred to as a thin film transistor (TFT)) using a semiconductor thin film formed over a substrate having an insulating surface. The transistor is applied to a wide range of electronic appliances such as an integrated circuit (IC) or an image display device (display device). A silicon-based semiconductor material is widely known as a material for a semiconductor thin film applicable to a transistor, while an oxide semiconductor has been attracting attention as another material.

For example, a transistor including a semiconductor layer formed using an amorphous oxide containing indium (In), gallium (Ga), and zinc (Zn) (In—Ga—Zn—O-based amorphous oxide) is disclosed (see Patent Document 1).

REFERENCE

Patent Document

[Patent Document 1] Japanese Published Patent Application No. 2011-181801

SUMMARY OF THE INVENTION

An oxygen vacancy in an oxide semiconductor serves as a donor to generate an electron that is a carrier in the oxide semiconductor. When many oxygen vacancies exist in an oxide semiconductor including a channel formation region of a transistor, electrons are generated in the channel formation region, which is a cause of shift of the threshold voltage of the transistor in the negative direction.

In order to achieve high-speed operation, low power consumption, high integration, cost reduction, or the like of a transistor, it is necessary to miniaturize a transistor. However, miniaturization of a transistor causes shift of the threshold voltage in the negative direction.

In view of the problem, an object of one embodiment of the present invention is to provide a semiconductor device including a transistor including an oxide semiconductor in a channel formation region in which the threshold voltage of the transistor can be controlled, which is a so-called normally-off switching element.

In addition, an object of one embodiment of the present invention is to enable a semiconductor device including a transistor in which an oxide semiconductor is used for a channel formation region to have stable electrical characteristics and high reliability.

In a transistor in which an oxide semiconductor is used for a channel formation region, a plurality of gate electrodes is provided. By controlling the plurality of gate electrodes, a normally-off switching element can be achieved. Specifics are described below.

One embodiment of the present invention is a semiconductor device including a first insulating film, an oxide semiconductor layer over the first insulating film and includes a channel formation region, a second insulating film covering the oxide semiconductor layer, a source electrode layer and a drain electrode layer electrically connected to the oxide semiconductor layer. The semiconductor device further includes a first gate electrode layer overlapping the channel formation region with the first insulating film provided therebetween, a second gate electrode layer overlapping the channel formation region with the second insulating film provided therebetween, and a third gate electrode layer overlapping a side surface of the oxide semiconductor layer perpendicular to a channel width direction with the second insulating film provided therebetween.

Another embodiment of the present invention relates to a semiconductor device including a transistor or a semiconductor device including a circuit including the transistor. For example, one embodiment of the present invention relates to a semiconductor device including a transistor in which a channel formation region is formed using an oxide semiconductor or a semiconductor device including a circuit which is formed by using such a transistor. For example, the present invention relates to an electronic appliance which includes, as a component, a semiconductor integrated circuit including an LSI, a CPU, a power device mounted in a power circuit, a memory, a thyristor, a converter, an image sensor, or the like, or a light-emitting display device including a light-emitting element or an electro-optical device typified by a liquid crystal display panel.

According to one embodiment of the present invention, a semiconductor device including a transistor including an oxide semiconductor in a channel formation region in which the threshold voltage of the transistor can be controlled, which is a so-called normally-off switching element, can be provided.

In a semiconductor device which includes a transistor including an oxide semiconductor, stable electrical characteristics can be provided and high reliability can be achieved.

BRIEF DESCRIPTION OF THE DRAWINGS

FIGS. 1A to 1C are a top view and cross-sectional views illustrating one embodiment of a semiconductor device.

FIGS. 11A to 11C each illustrate an example of a memory cell.

FIG. 12 shows an example of a memory cell.

DETAILED DESCRIPTION OF THE INVENTION

Figure 2A:
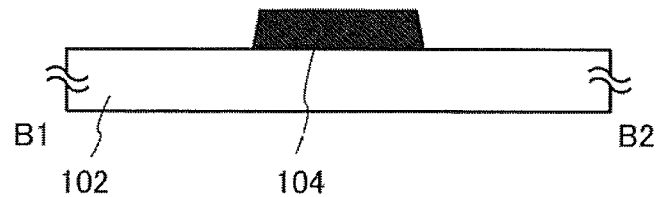
FIGS. 2A to 2D are cross-sectional views illustrating one embodiment of a method for manufacturing a semiconductor device.

Hereinafter, embodiments of the invention disclosed in this specification will be described with reference to the accompanying drawings. Note that the present invention is not limited to the following description, and it is easily understood by those skilled in the art that modes and details of the present invention can be modified in various ways. Therefore, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names which specify the present invention.

Note that the term such as "over" in this specification and the like does not necessarily mean that a component is placed "directly on" another component. For example, the expression "a gate electrode over a gate insulating film" can mean the case where there is an additional component between the gate insulating film and the gate electrode. The same applies to the term "below".

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

(Embodiment 1)

A structure example of a semiconductor device in this embodiment is illustrated in FIGS. 1A to 1C. FIG. 1A is a top view of the semiconductor device. FIG. 1B is a cross-sectional view taken along dashed-dotted line A1-A2 in FIG. 1A. FIG. 1C is a cross-sectional view taken along dashed-dotted line B1-B2 in FIG. 1A. Note that for simplification of the drawing, some components are illustrated in a see-through manner or not illustrated in the top view in FIG. 1A.

Note that FIG. 1B is a cross-sectional view in a channel width direction. FIG. 1C is a cross-sectional view in a channel length direction.

The semiconductor device shown in FIGS. 1A to 1C includes a first insulating film 106, an oxide semiconductor layer 108 over the first insulating film 106 and including a channel formation region, a second insulating film 114 over the oxide semiconductor layer 108, and a source electrode layer 110 and a drain electrode layer 112 electrically connected to the oxide semiconductor layer 108. The semiconductor device further includes a gate electrode layer 104 overlapping the channel formation region with the first insulating film 106 provided therebetween, a second gate electrode layer 116 overlapping the channel formation region with the second insulating film 114 provided therebetween, and a third gate electrode layer 118 overlapping a side surface of the oxide semiconductor layer 108 in a channel width direction with the second insulating film 114 provided therebetween.

In addition, in the semiconductor device shown in FIGS. 1A to 1C, the third gate electrode layers 118 are formed so as to face two side surfaces of the oxide semiconductor layer 108 in the channel width direction, which is represented as a third gate electrode layer 118a and a third gate electrode layer 118b. However, without limitation to this structure, the third gate electrode layer 118 may be formed to face one of the side surfaces of the oxide semiconductor layer 108 in the channel width direction. Note that it is more preferable that the third gate electrode layer 118 be formed so as to face the two side surfaces of the oxide semiconductor layer 108 in the channel width direction as shown in this embodiment because the threshold voltage of the transistor is easily controlled.

As described above, in one embodiment of the present invention, with the use of the plurality of gate electrode layers for the oxide semiconductor layer 108, the threshold voltage of the transistor is controlled, so that the transistor can be normally off. For example, each of the first gate electrode layer 104 and the third gate electrode layer 118 can be used as an electrode for controlling the threshold voltage of the transistor. The second gate electrode layer 116 can be used as an electrode for controlling the drive of the transistor. Note that the structures of the first to third gate electrode layers are not limited to them, and for example, the second gate electrode layer 116 may be used as an electrode for controlling the threshold voltage of the transistor. Note that in this embodiment, an example in which each of the first gate electrode layer 104 and the third gate electrode layer 118 are used as the electrode for controlling the threshold voltage of the transistor, and the second gate electrode layer 116 is used as the electrode for controlling the drive of the transistor is described below.

The first gate electrode layer 104 used as an electrode for controlling the threshold voltage of the transistor can apply an electric field perpendicularly to the channel formation region of the oxide semiconductor layer 108. In contrast, the third gate electrode layer 118 (the third gate electrode layers 118a and 118b) used as an electrode for controlling the threshold voltage of the transistor can apply electric filed horizontally to the channel formation region of the oxide semiconductor layer 108. That is, the first gate electrode layer 104 and the third gate electrode layer 118 can serve as a backgate electrode and a side gate electrode, respectively. By provision of the side gate electrode, the channel formation region of the oxide semiconductor layer 108 can be fully depleted or substantially fully depleted, and the transistor having such a structure has an effect of extremely low off-state current. In addition, the thickness of the oxide semiconductor layer 108 may be large. When the thickness of the oxide semiconductor layer 108 is large, the oxide semiconductor layer 108 can be easily influenced by a potential from the third gate electrode layer 118 and the threshold voltage can be easily controlled. The thickness of the oxide semiconductor layer 108 can be, for example, 15 nm to 1500 nm.

Here, an example of a method for controlling the threshold voltage of the transistor is described. For example, in the case where the threshold voltage of the transistor is controlled by only the first gate electrode layer 104, the first insulating film 106 is preferably formed thin so that an electric field can be applied to the oxide semiconductor layer 108. However, it is difficult to form the first insulating film 106 thin because the first insulating film 106 is preferably formed thick in order to supply oxygen to the oxide semiconductor layer 108. Therefore, it may be difficult to control the threshold voltage of the transistor by only the first gate electrode layer 104. In addition, the third gate electrode layer 118 is provided horizontally with respect to the channel formation region of the oxide semiconductor layer 108. Applying a perpendicular electric field to the channel formation region produces a larger effect on control of the threshold voltage of the transistor than applying a horizontal electric field. Therefore, it may be difficult to control the threshold voltage of the transistor by only the third gate electrode layer 118.

However, the semiconductor device according to one embodiment of the present invention can solve the problem by using two gate electrode layers, the first gate electrode layer 104 and the third gate electrode layer 118, for controlling the threshold voltage of the transistor. That is, the threshold voltage of the transistor is more easily controlled by combining control of the threshold voltage by the first gate electrode layer 104 and control of the threshold voltage of the third gate electrode layer 118.

In a method for controlling the threshold voltage of the semiconductor device which is described in this embodiment, for example, a potential applied to the first gate electrode layer 104 can be grounded (such a potential is also referred to as GND) or in a floating state and a potential applied to the third gate electrode layer 118 can be negative. When these potentials are applied to the first gate electrode layer 104 and the third gate electrode layer 118, the threshold voltage of the transistor can shift in the positive direction.

In addition, the first gate electrode layer 104 has a function of blocking an external electric field, that is, a function of preventing an external electric field (particularly, a function of preventing static electricity) from affecting a transistor. A function of preventing static electricity of the first gate electrode layer 104 can prevent the variation in the electric characteristics of the transistor due to the effect of external electric field such as static electricity.

In addition, in the semiconductor device shown in FIGS. 1A to 1C, the source electrode layer 110 has a stacked-layer structure of source electrode layers 110a and 110b, and the drain electrode layer 112 has a stacked-layer structure of drain electrode layers 112a and 112b, as an example.

When the source electrode layer 110 and the drain electrode layer 112 have stacked-layer structures, a transistor having a short channel length (also referred to as L length) can be fabricated. For example, when the source electrode layer 110a and the drain electrode layer 112a are formed using a conductive material being easily bonded to oxygen and are in contact with the oxide semiconductor layer 108, a phenomenon occurs, in which oxygen included in the oxide semiconductor layer 108 is diffused or moves into the conductive material being easily bonded to oxygen. Some heating steps are included in the manufacturing process of the transistor, and thus owing to the phenomenon, oxygen vacancies are generated in and around the region of the oxide semiconductor layer 108 which is in contact with the source electrode layer 110a and the drain electrode layer 112a, so that the region becomes an n-type.

In the semiconductor device in this embodiment, however, the source electrode layer 110b and the drain electrode layer 112b are formed over the source electrode layer 110a and the drain electrode layer 112a respectively, and a conductive material difficult to be bonded to oxygen is used for the source electrode layer 110b and the drain electrode layer 112b, so that a transistor having a short channel length (L length) can be fabricated. For example, the channel length (L length) of the transistor can be 100 nm or less, preferably 50 nm or less, further preferably 30 nm or less. Note that the channel length (L length) is a distance between the source electrode layer 110b and the drain electrode layer 112b in FIG. 1C. In addition, a region which is made to be n-type in the oxide semiconductor layer 108 is denoted by an n-type region 107 in FIG. 1C. Thus, the n-type region 107 can be used as a source region or a drain region of the transistor.

In the case where the second gate electrode layer 116 is used as the electrode for controlling the drive of the transistor, the channel formation region means a region of the oxide semiconductor layer 108 that overlaps with the second gate electrode layer 116 in FIG. 1C. Note that in the case where the n-type region 107 is formed in the oxide semiconductor layer 108, the channel formation region means a region of the oxide semiconductor layer 108 that overlaps with the second gate electrode layer 116 and is sandwiched between the n-type regions 107. As described above, a channel formation region is formed mainly in a region of the oxide semiconductor layer 108 that overlaps with the second gate electrode layer 116 and depends on the semiconductor characteristics of the oxide semiconductor layer 108. Accordingly, when the region of the oxide semiconductor layer 108 overlapping with the second gate electrode layer 116 is an i-type region, it serves as the channel formation region, whereas when it is an n-type region, it does not serve as the channel formation region in some cases. Further, a channel refers to a region through which current mainly flows in the channel formation region. For example, in FIG. 1C, the channel refers to a region of the oxide semiconductor layer 108, which is overlapped with the second gate electrode layer 116, is between the source electrode layer 110b and the drain electrode layer 112b, and is adjacent to the second gate insulating film 114.

In addition, the semiconductor device shown in this embodiment may include a third insulating film 120 over the second insulating film 114, the second gate electrode layer 116, and the third gate electrode layer 118. The third insulating film 120 can function as a protective film of the transistor.

Next, details of the elements included in the semiconductor devices illustrated in FIGS. 1A to 1C are described below.

The substrate 102 is not limited to a simple supporting substrate, and may be a substrate where another device such as a transistor is formed. In this case, at least one of the first gate electrode layer 104, the second gate electrode layer 116, the third gate electrode layer 118, the source electrode layer 110, and the drain electrode layer 112 may be electrically connected to another device described above.

Since the first gate electrode layer 104 is in contact with the first insulating film 106, a conductive material which is not easily bonded to oxygen is preferably used. As the conductive material, for example, a conductive nitride such as tantalum nitride or titanium nitride, or ruthenium is preferably used. Note that the conductive material which is not easily bonded to oxygen includes, in its category, a material to which oxygen is not easily diffused or transferred.

The first insulating film 106 can have a function of supplying oxygen to the oxide semiconductor layer 108 as well as a function of preventing diffusion of an impurity from the substrate 102; thus, the first insulating film 106 is an insulating film containing oxygen. It is particularly preferable that the first insulating film 106 be an insulating film containing excess oxygen. An oxide insulating film containing excess oxygen refers to an oxide insulating film from which oxygen can be released by heat treatment or the like. In other words, the first insulating film 106 is an oxide insulating film which can release oxygen by heating. The first insulating film 106 is preferably a film in which the amount of released oxygen when converted into oxygen atoms is $1.0 \times 10^{19}$ atoms/cm$^3$ or more in thermal desorption spectroscopy analysis. Further, excess oxygen refers to oxygen which can be transferred in the oxide semiconductor layer, silicon oxide, or silicon oxynitride by heat treatment, oxygen in excess of an intrinsic stoichiometric composition, or oxygen which can fill Vo (oxygen vacancy) caused by lack of oxygen. Oxygen released from the first insulating film 106 can be diffused to the channel formation region of the oxide semiconductor layer 108, so that oxygen vacancies which might be formed in the oxide semiconductor layer can be filled with the oxygen. In this manner, stable electrical characteristics of the transistor can be achieved.

Note that in the case where the substrate 102 is a substrate where another device is formed, the first insulating film 106 also has a function as an interlayer insulating film. In that case, the first insulating film 106 is preferably subjected to planarization treatment such as chemical mechanical polishing (CMP) treatment so as to have a flat surface.

An oxide semiconductor layer which can be used as the oxide semiconductor layer 108 preferably includes a layer represented by an In—M—Zn oxide, which contains at least indium (In), zinc (Zn), and M (M is a metal element such as Al, Ga, Ge, Y, Zr, Sn, La, Ce, or Hf). Details of a material and a formation method which can be used for the oxide semiconductor layer 108 are to be described in description of a method for fabricating the transistor.

Note that stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. The term "substantially intrinsic" refers to the state where an oxide semiconductor layer has a carrier density lower than $1 \times 10^{17}$/cm$^3$, preferably lower than $1 \times 10^{15}$/cm$^3$, further preferably lower than $1 \times 10^{13}$/cm$^3$.

In the oxide semiconductor layer, hydrogen, nitrogen, carbon, silicon, and metal elements except for main components of the oxide semiconductor are impurities. For example, hydrogen and nitrogen form donor levels to increase the carrier density. Silicon forms impurity levels in the oxide semiconductor layer. The impurity level becomes a trap, which might deteriorate the electric characteristics of the transistor.

Note that in order to make the oxide semiconductor layer intrinsic or substantially intrinsic, the concentration of silicon in the oxide semiconductor layer, which is measured by SIMS, is set to be lower than $1 \times 10^{19}$ atoms/cm$^3$, preferably lower than $5 \times 10^{18}$ atoms/cm$^3$, further preferably lower than $1 \times 10^{18}$ atoms/cm$^3$. The concentration of hydrogen in the oxide semiconductor layer is set to be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$. The concentration of nitrogen in the oxide semiconductor layer is set to be lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

In the case where the oxide semiconductor layer includes crystals, high concentration of silicon or carbon might reduce the crystallinity of the oxide semiconductor layer. In order not to lower the crystallinity of the oxide semiconductor layer, the concentration of silicon in the oxide semiconductor layer is set to be lower than $1 \times 10^{19}$ atoms/cm$^3$, preferably lower than $5 \times 10^{18}$ atoms/cm$^3$, more preferably lower than $1 \times 10^{18}$ atoms/cm$^3$. Moreover, the concentration of carbon can be set to be lower than $1 \times 10^{19}$ atoms/cm$^3$, preferably lower than $5 \times 10^{18}$ atoms/cm$^3$, more preferably lower than $1 \times 10^{18}$ atoms/cm$^3$.

A transistor in which a highly purified oxide semiconductor layer is used for a channel formation region as described above has extremely low off-state current, and the off-state current noimalized on the channel width of the transistor can be as low as several yoktoamperes per micrometer to several zeptoamperes per micrometer.

When the density of localized levels in the film of the oxide semiconductor which can be used for the oxide semiconductor layer 108 is reduced, stable electrical characteristics can be imparted to the transistor including the oxide semiconductor layer 108. Note that to impart stable electrical characteristics to the transistor, the absorption coefficient due to the localized levels in the oxide semiconductor layer 108, which is obtained in measurement by a constant photocurrent method (CPM), is set lower than $1 \times 10^{-3}$/cm, preferably lower than $3 \times 10^{-4}$/cm.

For the first source electrode layer 110a and the first drain electrode layer 112a, a conductive material which is easily bonded to oxygen can be used. For example, Al, Cr, Cu, Ta, Ti, Mo, or W can be used. In particular, Ti or W with a high melting point is preferably used, which allows subsequent process temperatures to be relatively high. Note that the conductive material which is easily bonded to oxygen includes, in its category, a material to which oxygen is easily diffused or transferred.

The n-type region 107 is a part of the oxide semiconductor layer 108 from which oxygen is extracted to the source electrode layer 110a and the drain electrode layer 112a sides and thus has many oxygen vacancies. In addition, the n-type region 107 may contain a component of the source electrode layer 110a and the drain electrode layer 112a. For example, in the case where a tungsten film is used as the source electrode layer 110a and the drain electrode layer 112a, a tungsten element may be contained in the n-type region 107.

However, in the case of forming a transistor with an extremely short channel length, the n-type region which is formed by the generation of the oxygen vacancies sometimes extends in the channel length direction of the transistor. In that case, electrical characteristics of the transistor change; for example, the threshold voltage shifts or on/off of the transistor cannot be controlled with the gate voltage (i.e., the transistor is on). Accordingly, when a transistor with an extremely short channel length is formed, it is not preferable that the conductive material which is easily bonded to oxygen be used for the source electrode and the drain electrode.

Thus, in this embodiment, the source electrode and the drain electrode have stacked-layer structures, and the source electrode layer 110b and the drain electrode layer 112b, which determine the channel length, are formed using the conductive material which is not easily bonded to oxygen. As the conductive material, for example, a conductive nitride such as tantalum nitride or titanium nitride, or ruthenium is preferably used. Note that the conductive material which is not easily bonded to oxygen includes, in its category, a material to which oxygen is not easily diffused or transferred.

By the use of the above conductive material which is not easily bonded to oxygen for the source electrode layer 110b and the drain electrode layer 112b, generation of oxygen vacancies in the channel formation region of the oxide semiconductor layer 108 can be suppressed, so that change of the channel into an n-type can be suppressed. In this manner, even a transistor with an extremely short channel length can have favorable electrical characteristics.

In the case where the source electrode and the drain electrode are formed using only the above conductive material which is not easily bonded to oxygen, the contact resistance with the oxide semiconductor layer 108 becomes too high; thus, it is preferable that as illustrated in FIG. 1C, the source electrode layer 110a and the drain electrode layer 112a be formed over the oxide semiconductor layer 108 and the source electrode layer 110b and the drain electrode layer 112b be formed so as to cover the source electrode layer 110a and the drain electrode layer 112a. At this time, it is preferable that the oxide semiconductor layer 108 have a large contact area with the source electrode layer 110a or the drain electrode layer 112a, and the oxide semiconductor layer 108 have a small contact area with the source electrode layer 110b or the drain electrode layer 112b. The region of the oxide semiconductor layer 108, which is in contact with the source electrode layer 110a or the drain electrode layer 112a, becomes an n-type region due to generation of oxygen vacancies. Owing to the n-type region, the contact resistance between the oxide semiconductor layer 108 and the source electrode layer 110a or the drain electrode layer 112a can be reduced. Accordingly, when the oxide semiconductor layer 108 has a large contact area with the source electrode layer 110a or the drain electrode layer 112a, the area of the n-type region can also be large.

The second insulating film 114 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The second insulating film 114 may be a stack of any of the above materials. Note that the second insulating film 114 functions as a gate insulating film.

For the second gate electrode layer 116 and the third gate electrode layer 118, a material of Al, Cr, Cu, Ta, Ti, Mo, W, or the like can be used.

It is preferable that a material to which oxygen is not easily diffused or transferred be used for the third insulating film 120. Further, a material containing little hydrogen when formed into a film is preferably used for the third insulating film 120. The hydrogen content of the third insulating film 120 is preferably lower than $5 \times 10^{19}/cm^3$, further preferably lower than $5 \times 10^{18}/cm^3$. Note that the third insulating film 120 functions as a protective insulating film of the transistor. When the hydrogen content of the third insulating film 120 has the above value, off-state current of the transistor can be low. For example, a silicon nitride film or a silicon nitride oxide film is preferably used as the third insulating film 120.

As described above, the transistor according to one embodiment of the present invention has a plurality of gate electrode layers, so that the threshold voltage of the transistor is controlled and thus a so-called normally-off switching element can be achieved. Further, a semiconductor device including the transistor can be provided.

This embodiment can be freely combined with any of the other embodiments in this specification.

(Embodiment 2)

In this embodiment, a method for manufacturing the semiconductor device shown in FIGS. 1A to 1C and described in Embodiment 1 will be described with reference to FIGS. 2A to 2D, FIGS. 3A to 3D, and FIGS. 4A to 4D.

First, the substrate 102 is prepared. For the substrate 102, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates further provided with a semiconductor element may be used.

Next, a conductive film is formed over the substrate 102 and is processed into a desired shape, whereby the first gate electrode layer 104 is formed (see FIG. 2A).

As the first gate electrode layer 104, for example, a conductive film containing tantalum nitride, titanium nitride, ruthenium, or an alloy material containing any of them as its main component is totaled as a single layer or a stacked layer by a sputtering method or the like.

Figure 2B:
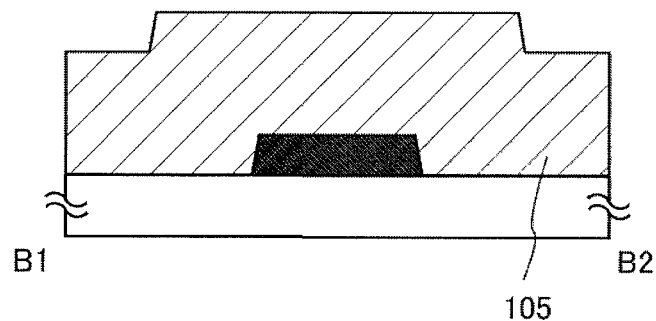

Next, the insulating film 105 is formed over the substrate 102 and the first gate electrode layer 104 (see FIG. 2B).

A material which can be used for the first insulating film 106 can be used for the insulating film 105. For example, the insulating film 105 can be formed by a plasma enhanced-chemical vapor deposition (PE-CVD) method, a sputtering method, or the like using an oxide insulating film of aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, or the like or a mixed material of any of these. Further, a stack of any of the above materials may be used, and at least an upper layer of the insulating film 105, which is in contact with the oxide semiconductor layer 108, is formed using a material containing oxygen that might serve as a supply source of oxygen to the oxide semiconductor layer 108.

Figure 2C:
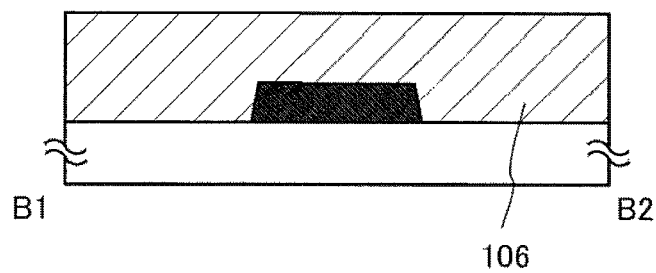

Next, the surface of the insulating film 105 is planarized to form the first insulating film 106 (see FIG. 2C). The first insulating film 106 can be formed by performing planarizing treatment such as a CMP method on the insulating film 105.

Oxygen may be added to the first insulating film 106 by an ion implantation method, an ion doping method, a plasma immersion ion implantation method, or the like. By addition of oxygen, the first insulating film 106 can further contain excess oxygen.

Figure 2D:
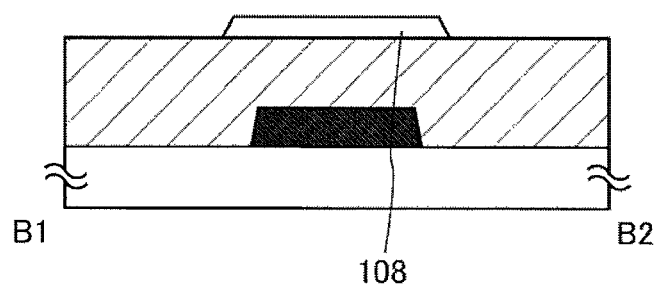

Then, an oxide semiconductor film is formed over the first insulating film 106 by a sputtering method, a CVD method, a molecular beam epitaxy (MBE) method, an atomic layer deposition (ALD) method, or a pulse laser deposition (PLD) method and selectively etched, so that the oxide semiconductor layer 108 is formed (see FIG. 2D). Note that heating may be performed before etching.

An oxide semiconductor layer which can be used for the oxide semiconductor layer 108 preferably includes a layer represented by an In—M—Zn oxide, which contains at least indium (In), zinc (Zn), and M (M is a metal element such as Al, Ga, Ge, Y, Zr, Sn, La, Ce, or Hf). Alternatively, the oxide semiconductor preferably contains both In and Zn. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that, for example, an In—Ga—Zn-based oxide means an oxide containing In, Ga, and Zn as its main components and there is no particular limitation on the ratio of In, Ga, and Zn. The In—Ga—Zn-based oxide may contain a metal element other than the In, Ga, and Zn. Further, in this specification, a film formed using an In—Ga—Zn oxide is also referred to as an IGZO film.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by a chemical formula, $In_2SnO_5(ZnO)_n$ (n>0, n is a natural number) may be used.

Note that the oxide semiconductor film is preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

In this specification, a term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, a term "perpendicular" indicates that the angle formed between two straight lines is from $80°$ to $100°$, and accordingly includes a case where the angle is from $85°$ to $95°$.

Most of the crystal parts included in the CAAC-OS film each fit inside a cube whose one side is less than 100 nm. Thus, there is a case where a crystal part included in the CAAC-OS film fits a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film obtained by using an electron beam having a probe diameter larger than the diameter of a crystal part (e.g., larger than or equal to 50 nm). Meanwhile, spots are shown in a nanobeam electron diffraction image of the nc-OS film obtained by using an electron beam having a probe diameter (e.g., larger than or equal to 1 nm and smaller than or equal to 30 nm) close to, or smaller than or equal to a diameter of a crystal part. Further, in a nanobeam electron diffraction image of the nc-OS film, regions with high luminance in a circular (ring) pattern are shown in some cases. Also in a nanobeam electron diffraction image of the nc-OS film, a plurality of spots is shown in a ring-like region in some cases.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, and nitrogen) which exist in the deposition chamber may be reduced. Furthermore, impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that x, y, and z are each a given positive number. The kinds of powder and the molar ratio for mixing powder may be determined as appropriate depending on the desired sputtering target.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more in order to compensate desorbed oxygen. By the first heat treatment, the crystallinity of the oxide semiconductor layer 108 can be improved, and in addition, impurities such as hydrogen and water can be removed from the first insulating film 106 and the oxide semiconductor layer 108. Note that the step of the first heat treatment may be performed before etching for formation of the oxide semiconductor layer 108.

Figure 3A:
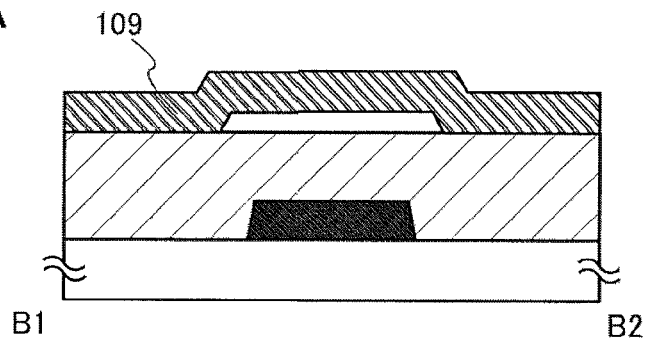
FIGS. 3A to 3D are cross-sectional views illustrating one embodiment of a method for manufacturing a semiconductor device.

Next, a conductive film 109 to be the source electrode layer 110a and the drain electrode layer 112a is formed over the oxide semiconductor layer 108 (see FIG. 3A). For the conductive film 109, Al, Cr, Cu, Ta, Ti, Mo, W, or an alloy material containing any of these as a main component can be used. For example, a 100-nm-thick tungsten film is formed by a sputtering method or the like.

Figure 3B:
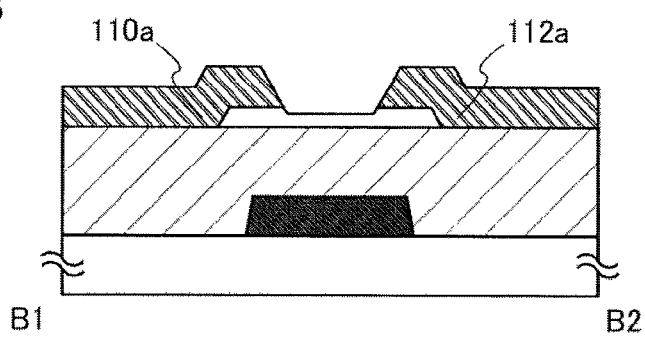

Next, the conductive film 109 is processed into a desired shape, whereby the source electrode layer 110a and the drain electrode layer 112a are formed (see FIG. 3B).

At this time, the conductive film 109 is over-etched, so that the oxide semiconductor layer 108 is partly etched as illustrated in FIG. 3B. However, when the etching selectivity of the conductive film 109 to the oxide semiconductor layer 108 is high, the oxide semiconductor layer 108 is hardly etched. Note that by over-etching the conductive film 109, part of the first insulating film 106, more specifically, the first insulating film 106 on the outer sides than the edges of the source electrode layer 110a and the drain electrode layer 112a is etched.

Figure 3C:
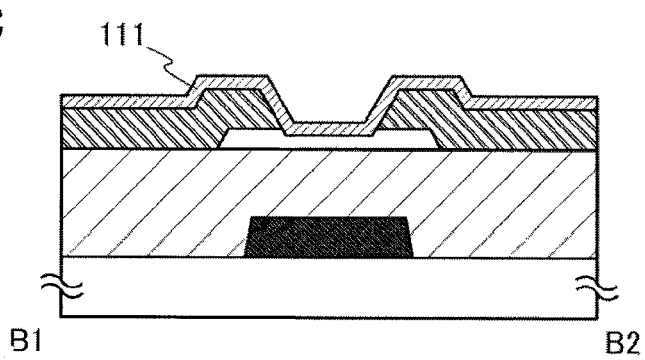

Then, a conductive film 111 to be the source electrode layer 110b and the drain electrode layer 112b are formed over the oxide semiconductor layer 108, the source electrode layer 110a, and the drain electrode layer 112a (see FIG. 3C). For the conductive film 111, a conductive nitride such as tantalum nitride or titanium nitride, ruthenium, or an alloy material containing any of these as a main component can be used. For example, a 20-nm-thick tantalum nitride film is formed by a sputtering method or the like.

Figure 3D:
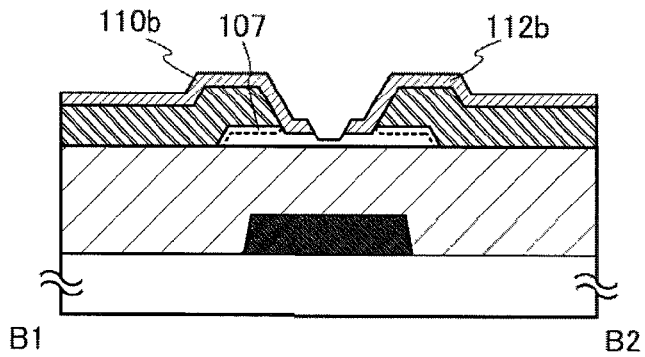

Next, the conductive film 111 is etched so as to be divided over the oxide semiconductor layer 108, so that the source electrode layer 110b and the drain electrode layer 112b are formed (see FIG. 3D). At this time, as illustrated in FIG. 3D, part of the oxide semiconductor layer 108 may be etched. When the source electrode layer 110b and the drain electrode layer 112b are etched, part of the first insulating film 106, more specifically, the first insulating film 106 on the outer sides than the edges of the source electrode layer 110b and the drain electrode layer 112b may be etched.

Note that in the case of forming a transistor whose channel length (a distance between the source electrode layer 110b and the drain electrode layer 112b) is extremely short, the source electrode layer 110a and the drain electrode layer 112a can be formed in such a manner that the conductive film 111 is etched first so as to cover the source electrode layer 110a and the drain electrode layer 112a, and then etched using resist masks that are processed by a method suitable for fine line processing, such as electron beam exposure. Note that by the use of a positive type resist for the resist masks, the exposed region can be minimized and throughput can be thus improved. In the above manner, a transistor having a channel length of 30 nm or less can be formed.

Next, second heat treatment is preferably performed. The second heat treatment can be performed in a condition similar to that of the first heat treatment. By the second heat treatment, impurities such as hydrogen and water can be further removed from the oxide semiconductor layer 108. Further, by the second heat treatment, the n-type region 107 is formed in the oxide semiconductor layer 108 being in contact with the source electrode layer 110a and the drain electrode layer 112a (see FIG. 3D). Note that the n-type region 107 can be formed not only by the second heat treatment but also by forming the conductive film 109 by a sputtering method or the like.

Figure 4A:
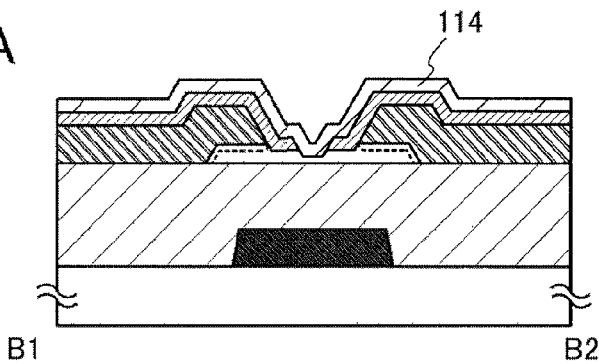
FIGS. 4A to 4D are cross-sectional views illustrating one embodiment of a method for manufacturing a semiconductor device.

Then, the second insulating film 114 is formed over the oxide semiconductor layer 108, the source electrode layer 110b, and the drain electrode layer 112b (see FIG. 4A). The second insulating film 114 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The second insulating film 114 may be a stack of any of the above materials. The second insulating film 114 can be formed by a sputtering method, a CVD method, an MBE method, an ALD method, a PLD method, or the like.

It is preferable that the second insulating film 114 be successively subjected to heat treatment after being formed. For example, the second insulating film 114 is formed with a PE-CVD apparatus and is successively subjected to heat treatment in a vacuum. The heat treatment can remove hydrogen, moisture, and the like from the second insulating film 114. By the heat treatment, the second insulating film 114 can be dehydrated or dehydrogenated to be dense.

Figure 4B:
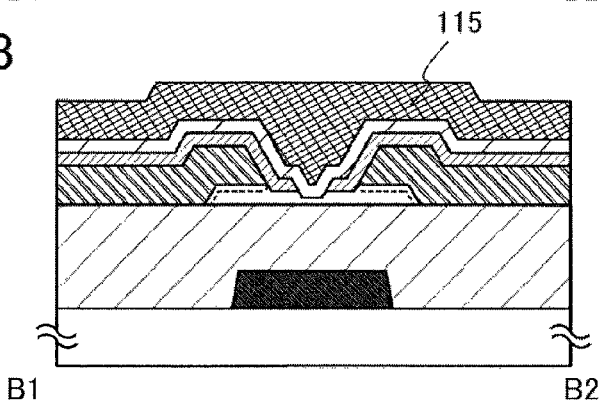

Next, a conductive film 115 to be the second gate electrode layer 116 and the third gate electrode layer 118 is fondled over the second insulating film 114 (see FIG. 4B).

A material which can be used for the second gate electrode layer 116 and the third gate electrode layer 118 can be used for the conductive film 115. For example, a stacked film of a 20-nm-thick tantalum nitride film and a 400-nm-thick tungsten film can be used as the conductive film 115.

Figure 4C:
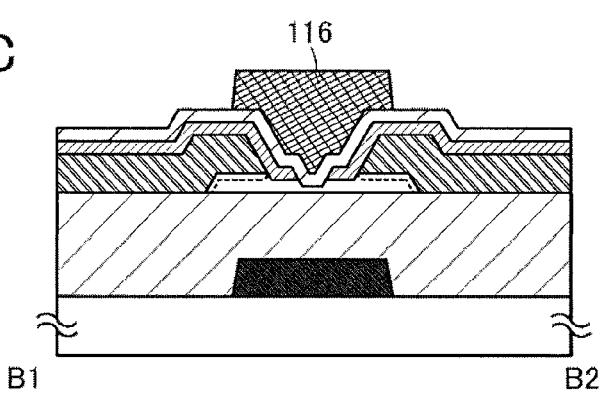

Next, the conductive film 115 is processed into a desired shape to form the second gate electrode layer 116 and the third gate electrode layer 118 (see FIG. 4C). Note that since FIG. 4C shows a cross section in the channel length direction, the third gate electrode layer 118 is not shown.

Figure 4D:
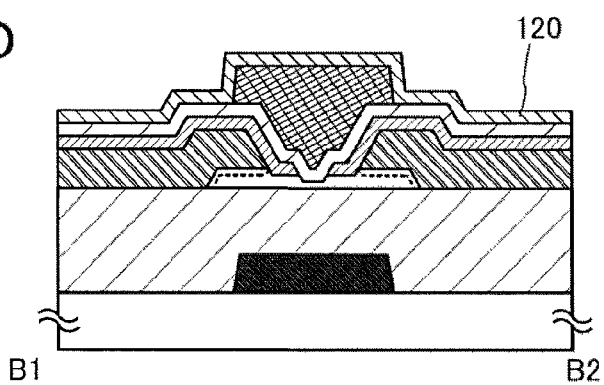

Next, the third insulating film 120 is formed over the second insulating film 114, the second gate electrode layer 116, and the third gate electrode layer 118 (see FIG. 4D). It is preferable that a material to which oxygen is not easily diffused or transferred be used for the third insulating film 120. Further, a material containing little hydrogen when formed into a film is preferably used for the third insulating film 120. The hydrogen content of the third insulating film 120 is preferably lower than $5 \times 10^{19}/cm^3$, further preferably lower than $5 \times 10^{18}/cm^3$. When the hydrogen content of the third insulating film 120 has the above value, off-state current of the transistor can be low.

For example, a silicon nitride film or a silicon nitride oxide film is preferably used as the third insulating film 120. The third insulating film 120 can be formed by a sputtering method, a CVD method, an MBE method, an ALD method, or a PLD method. In particular, for the third insulating film 120, a silicon nitride film is preferably formed by a sputtering method, in which case the content of water or hydrogen is low.

Next, third heat treatment is preferably performed. The third heat treatment can be performed under a condition similar to that of the first heat treatment. By the third heat treatment, oxygen is easily released from the first insulating film 106 and the second insulating film 114, so that oxygen vacancies in the oxide semiconductor layer 108 can be reduced.

Through the above manufacturing steps, the semiconductor device shown in FIGS. 1A to 1C can be manufactured.

Although the conductive films which are described in the above embodiment can be formed by a sputtering method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

Note that this embodiment can be combined with any of the other embodiments in this specification as appropriate.
(Embodiment 3)

In this embodiment, a transistor having a structure different from that of the transistor described in Embodiment 1 will be described with reference to FIGS. 5A to 5C, FIG. 6, FIGS. 7A and 7B, FIGS. 8A and 8B, and FIGS. 9A to 9C.

Figure 5A:
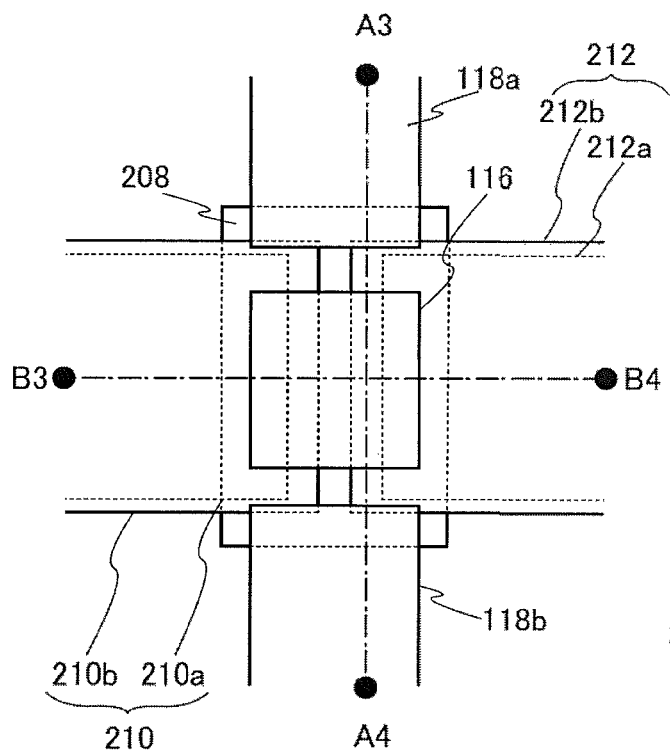
FIGS. 5A to 5C are top views and cross-sectional views illustrating one embodiment of a semiconductor device.
Figure 5B:
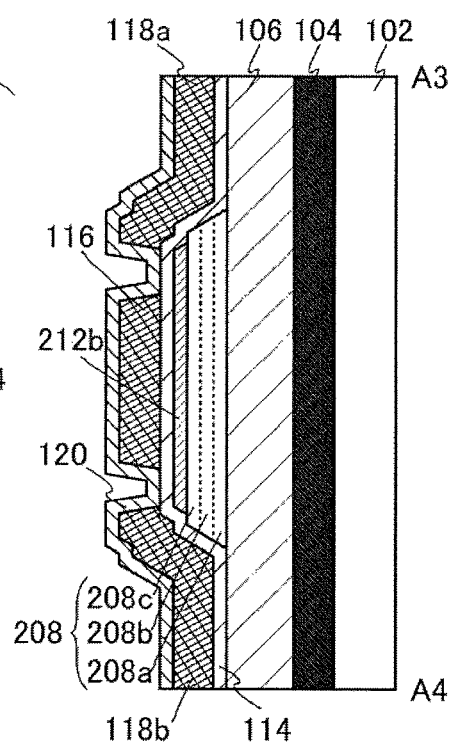
Figure 5C:
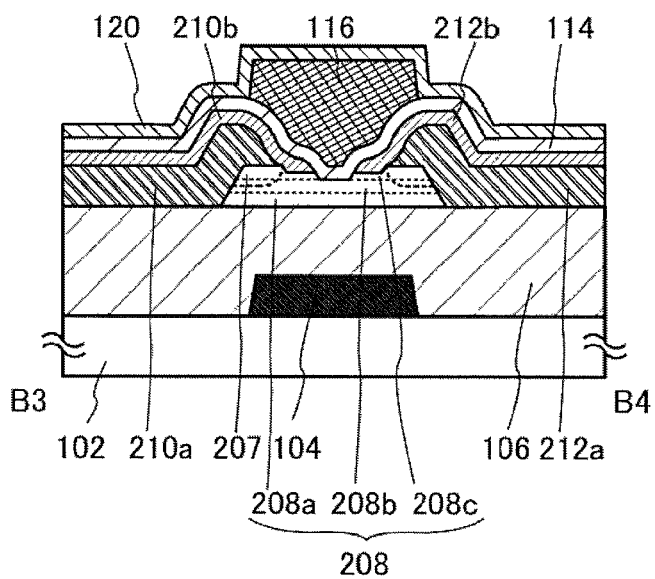

FIGS. 5A, 5B, and 5C are a top view and cross-sectional views which illustrate a transistor of one embodiment of the present invention. FIG. 5A is the top view of the transistor, and a cross section taken along a dashed-dotted line A3-A4 in FIG. 5A is illustrated in FIG. 5B. A cross section taken along a dashed-dotted line B3-B4 in FIG. 5A is illustrated in FIG. 5C. Note that for simplification of the drawing, some components in the top view in FIG. 5A are illustrated in a see-through manner or not illustrated. Note that the same portions as or portions having functions similar to those of the transistor described in Embodiment 1 are denoted by the same reference numerals, and repeated description thereof is omitted.

Note that FIG. 5B is a cross-sectional view in a channel width direction. FIG. 5C is a cross-sectional view in a channel length direction.

The semiconductor device shown in FIG. 5A to 5C includes the first insulating film 106 over the substrate 102, a first oxide layer 208a over the first insulating film 106, an oxide semiconductor layer 208b over the first oxide layer 208a and including a channel formation region, a second oxide layer 208c over the oxide semiconductor layer 208b, the second insulating film 114 covering the first oxide layer 208a, the oxide semiconductor layer 208b, and the second oxide layer 208c, and a source electrode layer 210 and a drain electrode layer 212 electrically connected to the oxide semiconductor layer 208b. The semiconductor device further includes the gate electrode layer 104 overlapping the channel formation region with the first insulating film 106 provided therebetween, the second gate electrode layer 116 overlapping the channel formation region with the second insulating film 114 provided therebetween, and the third gate electrode layer 118 overlapping a side surface of an oxide stack 208 in a channel width direction with the second insulating film 114 provided therebetween.

Note that the oxide stack 208 includes the first oxide layer 208a, the oxide semiconductor layer 208b, and the second oxide layer 208c.

As described above, in one embodiment of the present invention, with the use of the plurality of gate electrode layers for the oxide semiconductor layer 208b, the threshold voltage of the transistor is controlled, so that the transistor can be normally off. For example, each of the first gate electrode layer 104 and the third gate electrode layer 118 can be used as an electrode for controlling the threshold voltage of the transistor. The second gate electrode layer 116 can be used as an electrode for controlling the drive of the transistor.

In a method for controlling the threshold voltage of the semiconductor device which is described in this embodiment, for example, a potential applied to the first gate electrode layer 104 can be grounded (such a potential is also referred to as GND) or in a floating state and a potential applied to the third gate electrode layer 118 can be negative. When these potentials are applied to the first gate electrode layer 104 and the third gate electrode layer 118, the threshold voltage of the transistor can shift in the positive direction.

The semiconductor device shown in FIGS. 5A to 5C is different from the semiconductor device shown in FIGS. 1A to 1C in the structures of the oxide semiconductor layer, the source electrode layer, and the drain electrode layer. More specifically, the semiconductor device shown in FIGS. 5A to 5C, the oxide stack 208 including the first oxide layer 208a, the oxide semiconductor layer 208b, and the second oxide layer 208c is employed instead of the oxide semiconductor layer 108 shown in FIGS. 1A to 1C. In addition, the source electrode layer 210 and the drain electrode layer 212 are employed instead of the source electrode layer 110 and the drain electrode layer 112.

First, details of the source electrode layer 210 and the drain electrode layer 212 are described below.

The source electrode layer 210 includes a source electrode layer 210a and a source electrode layer 210b. The drain electrode layer 212 includes a drain electrode layer 212a and a drain electrode layer 212b. The material which can be used for the source electrode layer 110a and the drain electrode layer 112a described in Embodiment 1 can be used for the source electrode layer 210a and the drain electrode layer 212a. The material which can be used for the source electrode layer 110b and the drain electrode layer 112b described in Embodiment 1 can be used for the source electrode layer 210b and the drain electrode layer 212b.

The cross-section of the end portions of the source electrode layer 210 and the drain electrode layer 212 are different from that of the source electrode layer 110 and the drain electrode layer 112 shown in FIGS. 1A to 1C. More specifically, it is preferable that side surfaces of the source electrode layer 210 and the drain electrode layer 212 in the cross section be inclined and tapered at the edges rather than rise perpendicularly. That is, in the cross-sectional structures of the source electrode layer 210 and the drain electrode layer 212, the source electrode layer 210 and the drain electrode layer 212 each have a bottom end portion in contact with the oxide stack 208 and an upper end portion provided on the outer side than the bottom end portion, and the bottom end portion or the upper end portion, or both have curvatures. When the side surfaces of the source electrode layer 210 and the drain electrode layer 212 have the above-described structures, the coverage with the second insulating film 114 can be improved. Accordingly, breakdown voltage of the second insulating film 114 can be improved.

As conditions of forming the source electrode layer 210 and the drain electrode layer 212, a dry etching apparatus including inductively coupled plasma (ICP) which is a high-density plasma source can be used. The source electrode layer 210a and the drain electrode layer 212a are etched under the following conditions: the ICP is 2000 W, the bias is 50 W, the pressure is 0.67 Pa, the flow rate of $CF_4/O_2$ is 60/40 sccm, and the substrate temperature is 40° C. Etching conditions of the source electrode layer 210b and the drain electrode layer 212b are as follows: the ICP is 2000 W, the bias is 50 W, the pressure is 0.67 Pa, the flow rate of $CF_4$ is 100 sccm, and the substrate temperature is 40° C.

Note that in FIG. 5C, the n-type region in the oxide stack 208 is illustrated as the n-type region 207. The n-type region 207 can be formed in the second oxide layer 208c and the oxide semiconductor layer 208b. Thus, the n-type region 207 can be used as a source region or a drain region of the transistor.

In the case where the second gate electrode layer 116 is used as the electrode for controlling the drive of the transistor, the channel formation region means a region of the oxide stack 208 that overlaps with the second gate electrode layer 116 in FIG. 5C. Note that in the case where the n-type region 207 is formed in the oxide stack 208, the channel formation region means a region of the oxide stack 208 that overlaps with the second gate electrode layer 116 and is sandwiched between the n-type regions 207. The channel formation region is mainly formed in a region of the oxide stack 208 overlapping with the gate electrode layer 116 and depends on semiconductor characteristics of the oxide stack 208. Accordingly, when the region of the oxide stack 208 overlapping with the second gate electrode layer 116 is an i-type region, it serves as the channel formation region, whereas when it is an n-type region, it does not serve as the channel formation region in some cases. Further, a channel refers to a region through which current mainly flows in the channel formation region. For example, in FIG. 5C, the channel formation region means a region of the oxide semiconductor layer 208b that overlaps with the second gate electrode layer 116 and placed between the source electrode layer 210b and the drain electrode layer 212b.

Next, the oxide stack 208 shown in FIGS. 5A to 5C is described with reference to FIG. 6, FIGS. 7A and 7B, and FIGS. 8A and 8B.

Figure 6:
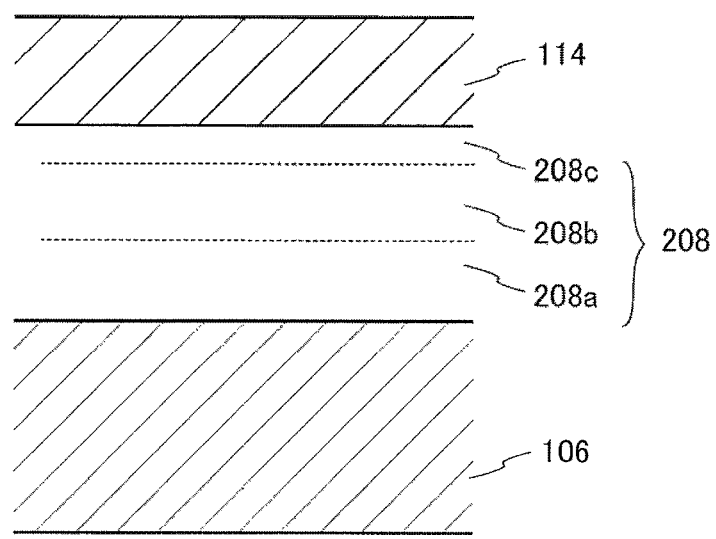
FIG. 6 illustrates a cross-sectional structure of an oxide stack according to one embodiment of the present invention.

The stacked-layer structure in FIG. 6 includes the oxide stack 208 between the first insulating film 106 and the second insulating film 114. Further, the oxide stack 208 includes the first oxide layer 208a, the oxide semiconductor layer 208b, and the second oxide layer 208c.

The oxide semiconductor layer 208b can have a structure similar to that of the oxide semiconductor layer 108 described in Embodiment 1.

Each of the first oxide layer 208a and the second oxide layer 208c is an oxide layer containing one or more kinds of metal elements which form the oxide semiconductor layer 208b.

The oxide semiconductor layer 208b includes a layer represented by an In—M—Zn oxide, which contains at least indium, zinc, and M (M is a metal element such as Al, Ga, Ge, Y, Zr, Sn, La, Ce, or Hf). The oxide semiconductor layer 208b preferably contains indium because the carrier mobility of a transistor is increased.

The first oxide layer 208a under the oxide semiconductor layer 208b includes an oxide layer which is represented by an In—M—Zn oxide (M is a metal element such as Al, Ti, Ga, Ge, Y, Zr, Sn, La, Ce, or Hf) and in which the proportion of M with respect to In in the atomic ratio is higher than that in the oxide semiconductor layer 208b. Specifically, the amount of any of the above elements in the first oxide layer 208a in an atomic ratio is 1.5 times or more, preferably 2 times or more, more preferably 3 times or more as much as that in the oxide semiconductor layer 208b in an atomic ratio. Any of the above elements is more strongly bonded to oxygen than indium, and thus has a function of suppressing generation of an oxygen vacancy in the oxide layer. That is, an oxygen vacancy is more unlikely to be generated in the first oxide layer 208a than in the oxide semiconductor layer 208b.

Further, the second oxide layer 208c over the oxide semiconductor layer 208b includes, similarly to the first oxide layer 208a, an oxide layer which is represented by an In—M—Zn oxide (M is a metal element such as Al, Ti, Ga, Ge, Y, Zr, Sn, La, Ce, or Hf) and in which the proportion of M with respect to In in the atomic ratio is higher than that in the oxide semiconductor layer 208b. Specifically, the amount of any of the above elements in the second oxide layer 208c in an atomic ratio is 1.5 times or more, preferably twice or more, more preferably three times or more as much as that in the oxide semiconductor layer 208b in an atomic ratio.

In other words, in the case where each of the first oxide layer 208a, the oxide semiconductor layer 208b, and the second oxide layer 208c is an In—M—Zn oxide containing at least indium, zinc, and M (M is a metal element such as Al, Ti, Ga, Ge, Y, Zr, Sn, La, Ce, or Hf), and further the first oxide layer 208a has an atomic ratio of In to M and Zn which is $x_1:y_1:z_1$, the oxide semiconductor layer 208b has an atomic ratio of In to M and Zn which is $x_2:y_2:z_2$, and the second oxide layer 208c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is 1.5 times or more as large as $y_2/x_2$, preferably 2 times or more, more preferably 3 times or more as large as $y_2/x_2$. At this time, when $y_2$ is greater than $x_2$ in the oxide semiconductor layer 208b, a transistor can have stable electrical characteristics. However, when $y_2$ is 3 times or more as large as $x_2$, the field-effect mobility of the transistor is reduced; accordingly, $y_2$ is preferably smaller than 3 times $x_2$.

Note that when the first oxide layer 208a is an In—M—Zn oxide, it is preferable that, in the atomic ratio of In and M, the proportion of In be less than 50 atomic % and the proportion of M be greater than or equal to 50 atomic %, and it is more preferable that, in the atomic ratio of In and M, the proportion of In be less than 25 atomic % and the proportion of M be greater than or equal to 75 atomic %. When the oxide semiconductor layer 208b is an In—M—Zn oxide, the atomic ratio of In to M is preferably as follows: the percentage of In is higher than or equal to 25 atomic % and the percentage of M is lower than 75 atomic %; further preferably, the percentage of In is higher than or equal to 34 atomic % and the percentage of M is lower than 66 atomic %. When the second oxide layer 208c is an In—M—Zn oxide, it is preferable that, in the atomic ratio of In and M, the proportion of In be less than 50 atomic % and the proportion of M be greater than or equal to 50 atomic %, and it is more preferable that, in the atomic ratio of In and M, the concentration of In be less than 25 atomic % and the proportion of M be greater than or equal to 75 atomic %.

The constituent elements of the first oxide layer 208a and the second oxide layer 208c may be different from each other, or their constituent elements may be the same at the same atomic ratios or different atomic ratios.

For the first oxide layer 208a, the oxide semiconductor layer 208b, and the second oxide layer 208c, for example, an oxide semiconductor containing indium, zinc, and gallium can be used. Typically, the first oxide layer 208a can be formed using an In—Ga—Zn oxide containing In, Ga, and Zn at an atomic ratio of 1:3:2, an In—Ga—Zn oxide containing In, Ga, and Zn at an atomic ratio of 1:6:4, an In—Ga—Zn oxide containing In, Ga, and Zn at an atomic ratio of 1:9:6, or an oxide containing In, Ga, and Zn in the vicinity of the above atomic ratios. The oxide semiconductor layer 208b can be formed using an In—Ga—Zn oxide containing In, Ga, and Zn at an atomic ratio of 1:1:1, an In—Ga—Zn oxide containing In, Ga, and Zn at an atomic ratio of 3:1:2, or an oxide containing In, Ga, and Zn in the vicinity of the above atomic ratios. The second oxide layer 208c is preferably formed using an In—Ga—Zn oxide containing In, Ga, and Zn at an atomic ratio of 1:3:2, an In—Ga—Zn oxide containing In, Ga, and Zn at an atomic ratio of 1:6:4, an In—Ga—Zn oxide containing In, Ga, and Zn at an atomic ratio of 1:9:6, or an oxide containing In, Ga, and Zn in the vicinity of the above atomic ratios.

The thickness of each of the first oxide layer 208a and the second oxide layer 208c is greater than or equal to 3 nm and less than or equal to 100 nm, preferably greater than or equal to 3 nm and less than or equal to 50 nm. The thickness of the oxide semiconductor layer 208b is greater than of equal to 3 nm and less than or equal to 200 nm, preferably greater than of equal to 3 nm and less than or equal to 100 nm, more preferably greater than of equal to 3 nm and less than or equal to 50 nm.

It is preferable that each of the first oxide layer 208a and the second oxide layer 208c contain one or more kinds of metal elements forming the oxide semiconductor layer 208b and be formed using an oxide layer whose energy at the bottom of the conduction band is closer to the vacuum level than that of the oxide semiconductor layer 208b by 0.05 eV or more, 0.07 eV or more, 0.1 eV or more, or 0.15 eV or more and 2 eV or less, 1 eV or less, 0.5 eV or less, or 0.4 eV or less. That is, it is preferable that each of the first oxide layer 208a and the second oxide layer 208c contain one or more kinds of metal elements forming the oxide semiconductor layer 208b and be formed using an oxide layer whose energy at the bottom of the conduction band is closer to the vacuum level than that of the oxide semiconductor layer 208b by more than or equal to 0.05 eV and less than or equal to 2 eV.

When an electric field is applied to the second gate electrode layer 116 in such a structure, a channel is formed in the oxide semiconductor layer 208b of the oxide stack 208, because the oxide semiconductor layer 208b has lowest energy at the bottom of the conduction band. In other words, the second oxide layer 208c is formed between the oxide semiconductor layer 208b and the second insulating film 114, whereby a structure in which the channel of the transistor is not in contact with the second insulating film 114 can be obtained.

Here, a band structure of the oxide stack 208 is described. A stack corresponding to the oxide stack 208 in which an In—Ga—Zn oxide having an energy gap of 3.15 eV is used as a layer corresponding to each of the first oxide layer 208a and the second oxide layer 208c and an In—Ga—Zn oxide having an energy gap of 2.8 eV is used as a layer corresponding to the oxide semiconductor layer 208b is fabricated, and the band structure thereof is analyzed. Note that for convenience, the stack is referred to as an oxide stack, and the layers forming the stack are referred to as a first oxide layer, an oxide semiconductor layer, and a second oxide layer.

The thickness of each of the first oxide layer, the oxide semiconductor layer, and the second oxide layer was 10 nm. The energy gap was measured with use of a spectroscopic ellipsometer (UT-300 manufactured by HORIBA Jobin Yvon). Further, the energy gap in the vicinity of an interface between the first oxide layer and the oxide semiconductor layer was 3 eV, and the energy gap in the vicinity of an interface between the second oxide layer and the oxide semiconductor layer was 3 eV.

Figure 7A:
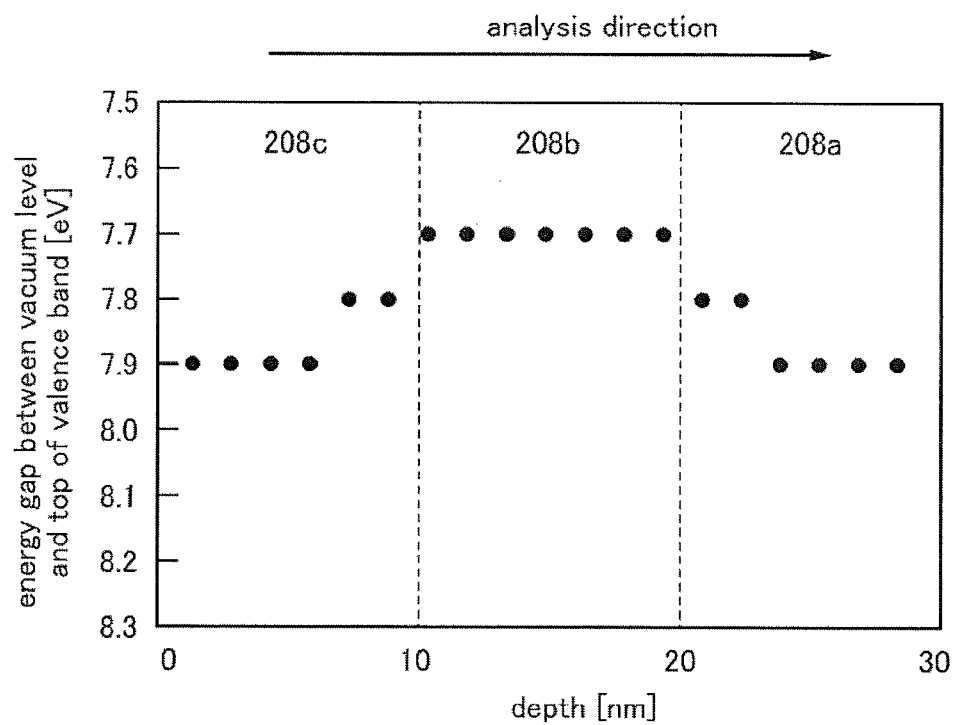
FIGS. 7A and 7B each illustrate an energy difference between the vacuum level and the bottom of the conduction band of an oxide stack according to one embodiment of the present invention.

In FIG. 7A, the energy gap between a vacuum level and a top of a valence band of each layer was measured while the oxide stack was etched from the second oxide layer side, and was plotted. The energy gap between the vacuum level and the top of the valence band was measured using an ultraviolet photoelectron spectroscopy (UPS) device (VersaProbe manufactured by ULVAC-PHI, Inc.).

Figure 7B:
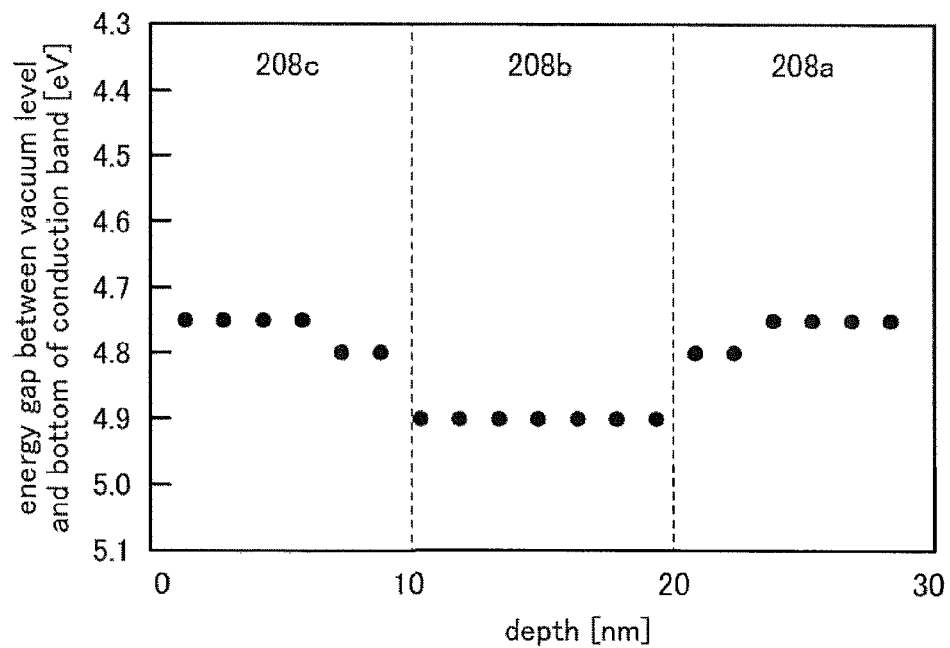

In FIG. 7B, an energy gap (electron affinity) between the vacuum level and a bottom of a conduction band of each layer, which was calculated by subtracting the energy gap of each layer from the energy gap between the vacuum level and the top of the valence band, was plotted.

Figure 8A:
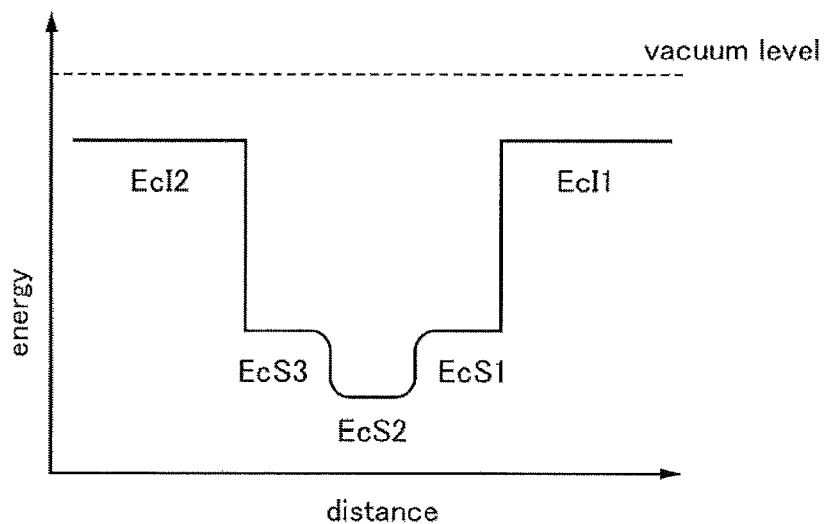
FIGS. 8A and 8B each illustrate a band structure of an oxide stack according to one embodiment of the present invention.

Part of the band structure in FIG. 7B is schematically shown in FIG. 8A. FIG. 8A shows the case where silicon oxide films are provided in contact with the first oxide layer and the second oxide layer. In FIG. 8A, the vertical axis represents energy and the horizontal axis represents distance. Here, EcI1 and EcI2 represent energy at the bottom of the conduction band of the silicon oxide film, EcS1 represents energy at the bottom of the conduction band of the first oxide layer, EcS2 represents energy at the bottom of the conduction band of the oxide semiconductor layer, and EcS3 represents energy at the bottom of the conduction band of the second oxide layer.

As shown in FIG. 8A, the energies of the bottoms of the conduction bands of the first oxide layer, the oxide semiconductor layer, and the second oxide layer are changed continuously. This can be understood also from the fact that the compositions of the first oxide layer, the oxide semiconductor layer, and the second oxide layer are close to each other and oxygen is easily diffused.

Figure 8B:
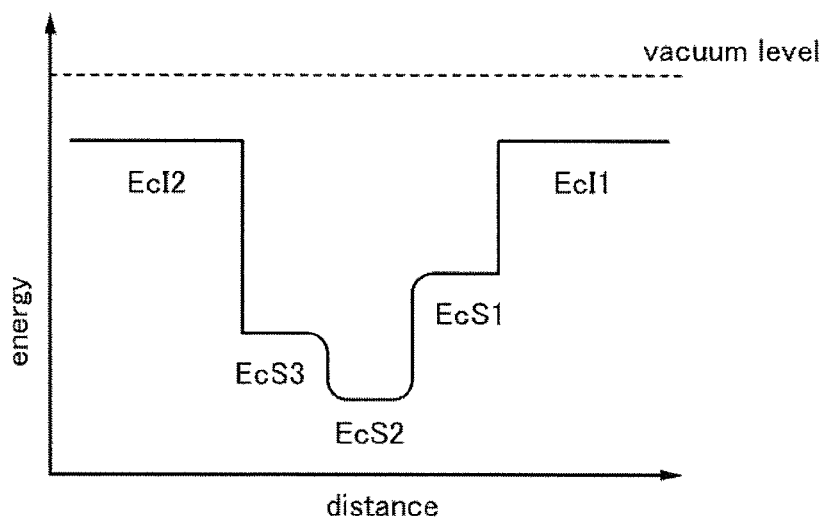

Note that although the case where the first oxide layer and the second oxide layer are oxide layers having the same energy gap is shown in FIG. 8A, the first oxide layer and the second oxide layer may be oxide layers having different energy gaps. For example, FIG. 8B shows part of the band structure in which EcS1 is higher than EcS3. Alternatively, although not shown in FIGS. 8A and 8B, EcS3 may be higher than EcS1.

According to FIGS. 7A and 7B and FIGS. 8A and 8B, in the transistor including the oxide stack, a channel is formed in the oxide semiconductor layer which serves as a well. Note that since the energies of the bottoms of the conduction bands are changed continuously, the oxide stack can also be referred to as a U-shaped well. Further, a channel formed to have such a structure can also be referred to as a buried channel.

Since each of the first oxide layer 208a and the second oxide layer 208c is an oxide layer containing one or more kinds of metal elements forming the oxide semiconductor layer 208b, the oxide stack 208 can also be referred to as an oxide stack in which layers containing the same main components are stacked. The oxide stack in which layers containing the same main components are stacked is formed to have a continuous junction (here, in particular, a well structure having a U shape in which energies of the bottoms of the conduction bands are changed continuously between any two of the layers). This is because when a defect level or an impurity for an oxide semiconductor, for example, a defect level such as a trapping center or a recombination center, or an impurity forming a barrier which inhibits the flow of carriers is mixed at an interface between any two of the layers, the continuity of the energy band is lost, and thus carriers are trapped or disappear by recombination at the interface.

In order to form continuous junction, the layers need to be stacked successively without being exposed to the air by using a multi-chamber deposition system (sputtering system) provided with a load lock chamber. Each chamber of the sputtering system is preferably evacuated to a high vacuum (to about $1\times10^{-4}$ Pa to $5\times10^{-7}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

Not only high vacuum evaporation in a chamber but also high purity of a sputtering gas is necessary to obtain a high-purity intrinsic oxide semiconductor. When a highly purified gas having a dew point of $-40°$ C. or lower, preferably $-80°$ C. or lower, more preferably $-100°$ C. or lower is used as an oxygen gas or an argon gas used as a sputtering gas, moisture or the like can be prevented from entering an oxide semiconductor as much as possible.

The first oxide layer 208a and the second oxide layer 208c which are provided over and under the oxide semiconductor layer 208b each serve as a barrier layer and can prevent a trap level formed at an interface between the oxide stack 208 and each of the insulating layers which are in contact with the oxide stack 208 (the first insulating film 106 and the second insulating film 114) from adversely affecting the oxide semiconductor layer 208b which serves as a main carrier path for the transistor.

For example, oxygen vacancies contained in the oxide semiconductor layer appear as localized states in deep energy area in the energy gap of the oxide semiconductor. A carrier is trapped in such localized states, so that reliability of the transistor is lowered. For this reason, oxygen vacancies contained in the oxide semiconductor layer need to be reduced. The oxide layers in which oxygen vacancies are less likely to be generated than in the oxide semiconductor layer 208b are provided over and under and in contact with the oxide semiconductor layer 208b in the oxide stack 208, whereby oxygen vacancies in the oxide semiconductor layer 208b can be reduced. For example, in the oxide semiconductor layer 208b, the absorption coefficient due to the localized levels, which is obtained by measurement by a constant photocurrent method (CPM) is set lower than $1\times10^{-3}$/cm, preferably lower than $1\times10^{-4}$/cm.

Further, in the case where the oxide semiconductor layer 208b is in contact with an insulating layer including a different constituent element (e.g. a base insulating layer including a silicon oxide film), an impurity element (e.g., silicon) might be mixed into the oxide semiconductor layer 208b where a channel is formed. When an interface level is formed at an interface between these layers by the mixed impurity element, decrease in electrical characteristics of the transistor, such as a change in a threshold voltage of the transistor, is caused. However, since the first oxide layer 208a contains one or more kinds of metal elements forming the oxide semiconductor layer 208b in the oxide stack 208, an interface level is less likely to be formed at an interface between the first oxide layer 208a and the oxide semiconductor layer 208b. Thus, providing the first oxide layer 208a makes it possible to reduce fluctuation in the electrical characteristics of the transistor, such as threshold voltage.

In the case where a channel is formed in the vicinity of the interface between the second insulating film 114 and the oxide semiconductor layer 208b, interface scattering occurs at the interface, whereby the field-effect mobility of the transistor is reduced. However, since the second oxide layer 208c contains one or more kinds of metal elements forming the oxide semiconductor layer 208b in the oxide stack 208, scattering of carriers is less likely to occur at an interface between the second oxide layer 208c and the oxide semiconductor layer 208b, and thus the field-effect mobility of the transistor can be increased.

Further, the first oxide layer 208a and the second oxide layer 208c each also serve as a barrier layer which suppresses formation of an impurity level due to the entry of the constituent elements of the insulating layers which are in contact with the oxide stack 208 (the first insulating film 106 and the second insulating film 114) into the oxide semiconductor layer 208b.

For example, in the case of using a silicon-containing insulating layer as each of the first insulating film 106 and the second insulating film 114 which are in contact with the oxide stack 208, the silicon in the insulating layers or carbon which might be contained in the insulating layers enters the first oxide layer 208a or the second oxide layer 208c at a depth of several nanometers from the interface in some cases. An impurity such as silicon, carbon, or the like entering the oxide semiconductor layer forms impurity levels. The impurity levels serve as a donor and generates an electron, so that the oxide semiconductor layer may become n-type.

However, when the thickness of the first oxide layer 208a and the second oxide layer 208c is larger than several nanometers, the impurity such as silicon or carbon does not reach the oxide semiconductor layer 208b, so that the influence of impurity levels is suppressed.

Here, the concentration of silicon in the oxide semiconductor layer is lower than or equal to $3 \times 10^{18}$ atoms/cm$^3$, preferably lower than or equal to $1 \times 10^{18}$ atoms/cm$^3$, further preferably lower than or equal to $3 \times 10^{17}$ atoms/cm$^3$. In addition, the concentration of carbon in the oxide semiconductor layer is lower than or equal to $3 \times 10^{18}$ atoms/cm$^3$, preferably lower than or equal to $3 \times 10^{17}$ atoms/cm$^3$. It is particularly preferable to sandwich or surround the oxide semiconductor layer 208b serving as a carrier path by the first oxide layer 208a and the second oxide layer 208c in order to prevent entry of much silicon or carbon, which is a Group 14 element, to the oxide semiconductor layer 208b. That is, the concentration of silicon and carbon contained in the oxide semiconductor layer 208b is preferably lower than that in the first oxide layer 208a and the second oxide layer 208c.

Note that the impurity concentration of the oxide semiconductor layer can be measured by secondary ion mass spectrometry (SIMS).

If hydrogen or moisture is contained in the oxide semiconductor layer, it can work as a donor and form an n-type region; therefore, in order to achieve a well-shaped structure, it is useful to provide a protective insulating layer (e.g. a silicon nitride layer) for preventing entry of hydrogen or moisture from the outside, above the oxide stack 208.

As illustrated in FIGS. 8A and 8B, trap levels derived from an impurity or a defect can be formed in the vicinity of the interfaces between the first and the second oxide layers and the insulating films such as the silicon oxide films. The first and the second oxide layers enable the oxide semiconductor layer and the trap states to be distanced from each other. However, in the case where an energy difference between EcS1 or EcS3 and EcS2 is small, electrons in the oxide semiconductor layer might reach the trap state by passing over the energy gap. When the electrons are captured by the trap level, they become negative fixed charge, so that the threshold voltage of the transistor shifts in the positive direction.

Thus, the energy gap between EcS1 and EcS2 and the energy gap between EcS3 and EcS2 are each preferably greater than or equal to 0.1 eV, more preferably greater than or equal to 0.15 eV because the amount of change of the threshold voltage of the transistor is reduced and the transistor has stable electrical characteristics.

Each of the oxide layers included in the multi-layer structure is formed using a sputtering target which contains at least indium (In) and with which a film can be formed by a sputtering method, preferably a DC sputtering method. When the sputtering target contains indium, the conductivity thereof is increased; therefore, film formation by a DC sputtering method is facilitated.

As a material forming the first oxide layer 208a and the second oxide layer 208c, a material which is represented by an In—M—Zn oxide (M is a metal element such as Al, Ti, Ga, Ge, Y, Zr, Sn, La, Ce, or Hf) is used. As M, Ga is preferably used. However, a material with a high proportion of Ga, specifically the material represented as $InGa_XZn_YO_Z$ with X exceeding 10, is not suitable because powder may be generated in the deposition and deposition by a DC sputtering method may become difficult.

Note that for each of the first oxide layer 208a and the second oxide layer 208c, a material in which the proportion of indium in the atomic ratio is smaller than a material used for the oxide semiconductor layer 208b is used. The indium and gallium contents in the oxide layers can be compared with each other by time-of-flight secondary ion mass spectrometry (also referred to as TOF-SIMS) or X-ray photoelectron spectrometry (also referred to as XPS).

When the first oxide layer 208a contains a constituent element (e.g. silicon) of the first insulating film 106 as an impurity, it might have an amorphous structure. Note that the oxide semiconductor layer 208b in which a channel is formed preferably has a crystal part. In the case where the oxide semiconductor layer 208b having a crystal part is stacked over the first oxide layer 208a having an amorphous structure, the oxide stack can be referred to as a hetero structure having different crystal structures.

In addition, the second oxide layer 208c may have an amorphous structure or include a crystal part. Formation of the second oxide layer 208c over the oxide semiconductor layer 208b having a crystal part allows the second oxide layer 208c to have a crystal structure. In this case, a boundary between the oxide semiconductor layer 208b and the second oxide layer 208c cannot be clearly identified by observation of the cross section with a transmission electron microscope (TEM) in some cases. Note that the second oxide layer 208c has lower crystallinity than the oxide semiconductor layer 208b. Hence, it can be said that the boundary can be determined by the degree of crystallinity.

At least the oxide semiconductor layer 208b in the oxide stack 208 is preferably a CAAC-OS. For the details of the CAAC-OS, the description in Embodiment 2 can be referred to. When the oxide semiconductor layer 208b has high crystallinity like the CAAC-OS described above, the variation of the threshold voltage of the transistor can be reduced and the electric characteristics can be stable.

As described above, an oxide stack is provided to be in contact with an oxide semiconductor to form an oxide stack including the oxide semiconductor and the oxide, whereby it is possible to prevent an impurity such as hydrogen or moisture or an impurity contained in an insulating film in contact with the oxide semiconductor from entering the oxide semiconductor film and forming a carrier.

Further, with such an oxide stack, interface scattering is unlikely to occur at the interface between the oxide and the oxide semiconductor. Thus, motion of carriers is not impeded at the interface, resulting in higher electric-field mobility of the transistor. In addition, the formation of the oxide in contact with the oxide semiconductor can prevent impurities from entering the oxide semiconductor film, so that the transistor including the oxide semiconductor can have stable electrical characteristics.

Figure 9A:
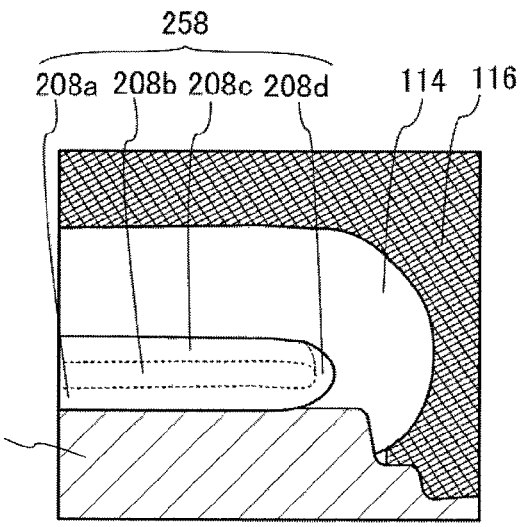
FIGS. 9A to 9C illustrate a cross-sectional structure of an oxide stack according to one embodiment of the present invention.
Figure 9B:
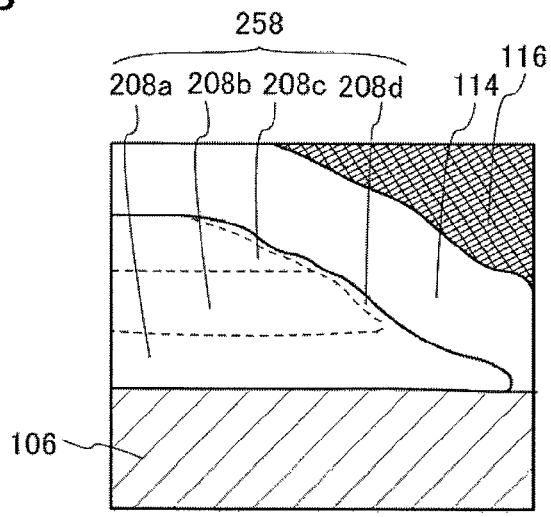
Figure 9C:
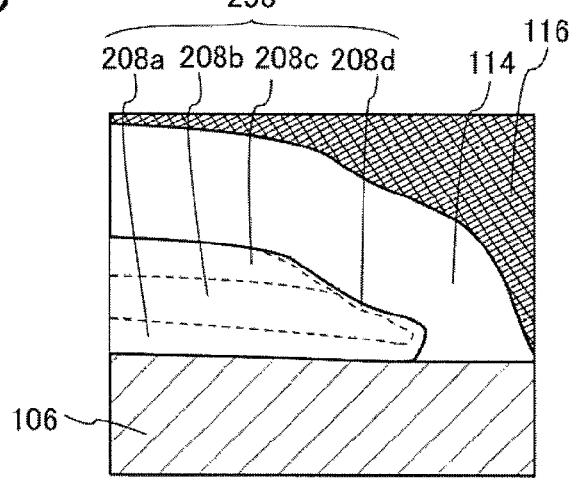

In addition, the oxide stack 208 including the oxide semiconductor layer 208b can have the structure shown in FIGS. 9A to 9C.

FIGS. 9A to 9C illustrate examples of cross-sectional structures of the oxide stack 258. The oxide stack 258 includes the first oxide layer 208a over the insulating film 106, the oxide semiconductor layer 208b over the first oxide layer 208a, the second oxide layer 208c over the oxide semiconductor layer 208b, and a third oxide layer 208d that is in contact with the side surface of the first oxide layer 208a and the side surface of the oxide semiconductor layer 208b. The oxide semiconductor layer 208b is surrounded by the first oxide layer 208a, the second oxide layer 208c, and the third oxide layer 208d. In addition, the third oxide layer 208d is in contact with the second insulating film 114 and the second gate electrode layer 116 is formed in contact with the second insulating film 114.

The oxide stack 258 illustrated in FIG. 9A has a curved surface with one arbitrary curvature radius or plural arbitrary curvature radii. In this case, at least a part of the surface of the third oxide layer 208d in contact with the second insulating film 114 is a curved surface.

The third oxide layer 208d includes, for example, a material that can be applied to the first oxide layer 208a. The third oxide layer 208d is formed as follows: for example, when the first oxide layer 208a, the oxide semiconductor layer 208b, and the second oxide layer 208c are etched by a dry etching method or the like, a reaction product of the first oxide layer 208a is attached to the side surfaces of the oxide semiconductor layer 208b and the second oxide layer 208c.

In some cases, the first insulating film 106 is overetched and formed in a stepped shape in the cross section when the third oxide layer 208d is formed.

Note that the first oxide layer 208a, the second oxide layer 208c, and the third oxide layer 208d cannot be strictly distinguished from each other in some cases. For that reason, the oxide semiconductor layer 208b can be said to be surrounded by the oxide.

Alternatively, the oxide stack 258 may have a structure illustrated in FIG. 9B. The oxide stack 258 illustrated in FIG. 9B has an inclined (tapered angle) region at an end portion. By formation of the inclined (tapered angle) region at the end portion, the coverage with the second insulating film 114 can be improved. Alternatively, a structure in which part of the tapered region is cut as illustrated in FIG. 9C may be employed.

As described above, the semiconductor device in this embodiment includes the oxide stack which is a stacked-layer including the oxide semiconductor layer and the oxide layers formed over and under and in contact with the oxide semiconductor layer, and in the cross section of the oxide stack, the oxide stack has a curved surface or an inclined region. Because the cross-section of the oxide stack has a curved surface or an inclined curve surface, the coverage of the oxide stack with a layer to be formed thereover can be improved. Accordingly, a film can be formed uniformly over the oxide stack, and thus, intrusion of an impurity element into the oxide stack from a region with low film density or a region without the film formed can be inhibited so that deterioration of characteristics of the semiconductor device can be prevented. Therefore, a semiconductor device having stable characteristics can be provided.

As described above, the transistor according to one embodiment of the present invention has a plurality of gate electrode layers, so that the threshold voltage of the transistor is controlled and thus a so-called normally-off switching element can be achieved. Further, a semiconductor device including the transistor can be provided. Further, a semiconductor device including the transistor can be provided.

This embodiment can be freely combined with any of the other embodiments in this specification.

(Embodiment 4)

In this embodiment, a modification example of the transistor in Embodiment 3 with reference to FIGS. 5A to 5C is described with reference to FIGS. 10A to 10C.

Figure 10A:
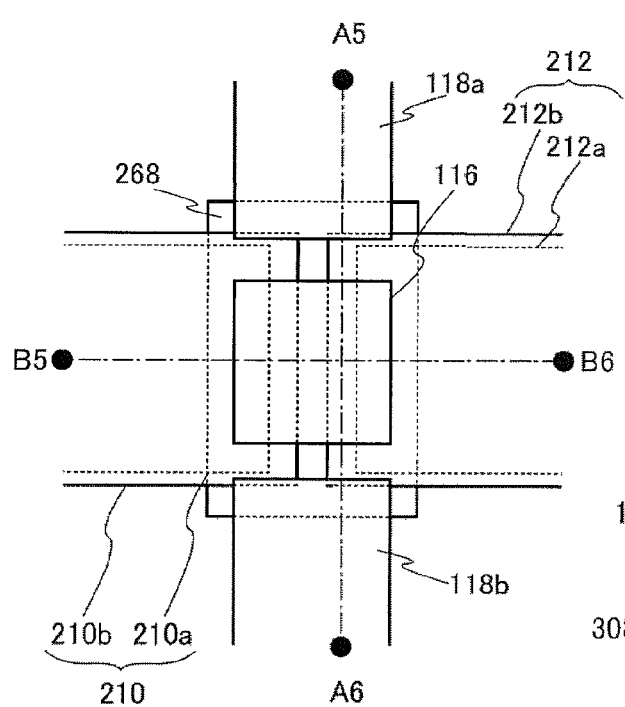
FIGS. 10A to 10C are a top view and cross-sectional views illustrating one embodiment of a semiconductor device.
Figure 10B:
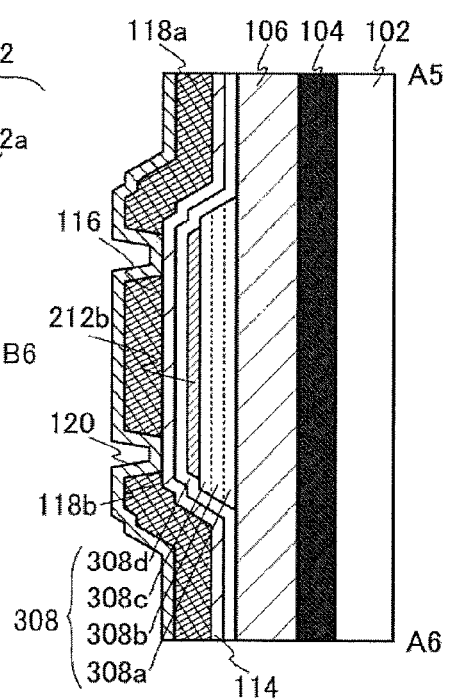
Figure 10C:
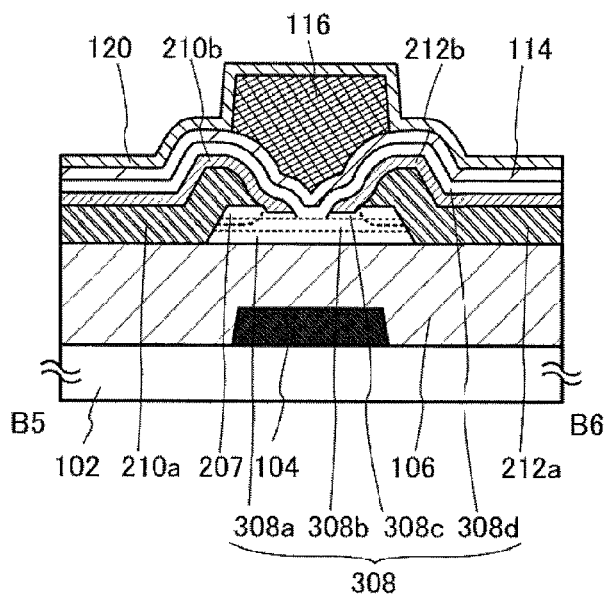

FIGS. 10A, 10B, and 10C are a top view and cross-sectional views which illustrate a transistor of one embodiment of the present invention. FIG. 10A is the top view of the transistor, and a cross section taken along a dashed-dotted line A5-A6 in FIG. 10A is illustrated in FIG. 10B. A cross section taken along a dashed-dotted line B5-B6 in FIG. 10A is illustrated in FIG. 10C. Note that for simplification of the drawing, some components in the top view in FIG. 10A are illustrated in a see-through manner or not illustrated. Note that the same portions as or portions having functions similar to those of the transistor described in Embodiment 1 or 3 are denoted by the same reference numerals, and repeated description thereof is omitted.

Note that FIG. 10B is a cross-sectional view in a channel width direction. FIG. 10C is a cross-sectional view in a channel length direction.

The semiconductor device shown in FIGS. 10A to 10C includes the first insulating film 106, an oxide stack 308 over the first insulating film 106 and including a channel formation region, the second insulating film 114 over the oxide stack 308, and the source electrode layer 210 and the drain electrode layer 212 electrically connected to the oxide stack 308. The semiconductor device further includes the gate electrode layer 104 overlapping the channel formation region with the first insulating film 106 provided therebetween, the second gate electrode layer 116 overlapping the channel formation region with the second insulating film 114 provided therebetween, and the third gate electrode layer 118 overlapping a side surface of the oxide stack 308 in a channel width direction with the second insulating film 114 provided therebetween.

The oxide stack 308 includes a first oxide layer 308a, an oxide semiconductor layer 308b, a second oxide layer 308c, and a third oxide layer 308d.

As described above, in one embodiment of the present invention, with the use of the plurality of gate electrode layers for the oxide semiconductor layer 308b, the threshold voltage of the transistor is controlled, so that the transistor can be normally off. For example, each of the first gate electrode layer 104 and the third gate electrode layer 118 can be used as an electrode for controlling the threshold voltage of the transistor. The second gate electrode layer 116 can be used as an electrode for controlling the drive of the transistor. Note that the structures of the first to third gate electrode layers are not limited to them, and for example, the second gate electrode layer 116 may be used as an electrode for controlling the threshold voltage of the transistor.

In a method for controlling the threshold voltage of the semiconductor device which is described in this embodiment, for example, a potential applied to the first gate electrode layer 104 can be grounded (such a potential is also referred to as GND) or in a floating state and a potential applied to the third gate electrode layer 118 can be negative. When these potentials are applied to the first gate electrode layer 104 and the third gate electrode layer 118, the threshold voltage of the transistor can shift in the positive direction.

The semiconductor device shown in FIGS. 10A to 10C is different from the semiconductor device shown in FIGS. 5A to 5C in the structure of the oxide stack. More specifically, a method for manufacturing the oxide stack is different. The oxide stack 308 of the semiconductor device in FIGS. 10A to 10C can be formed as follows: the first oxide layer 308a, the oxide semiconductor layer 308b, and the second oxide layer 308c are formed, the source electrode layer 210 and the drain electrode layer 212 are formed, and then the third oxide layer 308d is formed over the second oxide layer 308c, the source electrode layer 210, and the drain electrode layer 212.

The first oxide layer 308a, the oxide semiconductor layer 308b, and the second oxide layer 308c can be formed using a material having a composition similar to that of the first oxide layer 208a, the oxide semiconductor layer 208b, and the second oxide layer 208c described in Embodiment 3, respectively. The third oxide layer 308d can be formed using a material having a composition similar to those of the first oxide layer 308a and the second oxide layer 308c.

For the first oxide layer 308a, the oxide semiconductor layer 308b, the second oxide layer 308c, and the third oxide layer 308d, for example, an oxide semiconductor containing indium, zinc, and gallium can be used. Typically, the first oxide layer 308a can be formed using an In—Ga—Zn oxide containing In, Ga, and Zn at an atomic ratio of 1:3:2, an In—Ga—Zn oxide containing In, Ga, and Zn at an atomic ratio of 1:6:4, an In—Ga—Zn oxide containing In, Ga, and Zn at an atomic ratio of 1:9:6, or an oxide containing In, Ga, and Zn in the vicinity of the above atomic ratios. The oxide semiconductor layer 308b can be formed using an In—Ga—Zn oxide containing In, Ga, and Zn at an atomic ratio of 1:1:1, an In—Ga—Zn oxide containing In, Ga, and Zn at an atomic ratio of 3:1:2, or an oxide containing In, Ga, and Zn in the vicinity of the above atomic ratios. The second oxide layer 308c is preferably formed using an In—Ga—Zn oxide containing In, Ga, and Zn at an atomic ratio of 1:3:2, an In—Ga—Zn oxide containing In, Ga, and Zn at an atomic ratio of 1:6:4, an In—Ga—Zn oxide containing In, Ga, and Zn at an atomic ratio of 1:9:6, or an oxide containing In, Ga, and Zn in the vicinity of the above atomic ratios.

Note that it is preferable in the above structure that the third oxide layer 308d contain the same amount of Ga as that of the second oxide layer 308c or contain larger amount of Ga than that of the second oxide layer 308c. When the amount of Ga contained in the third oxide layer 308d is larger than that of the second oxide layer 308c, the energy at the bottom of the conduction band can be closer to a vacuum level than that of the second oxide layer 308c.

The above structure can be obtained when the oxide stack 308 has the following structure: for example, the first oxide layer 308a is formed using an In—Ga—Zn-oxide having an atomic ratio of In to Ga and Zn which is 1:3:2, the oxide semiconductor layer 308b is formed using an In—Ga—Zn-oxide having an atomic ratio of In to Ga and Zn which is 1:1:1, the second oxide layer 308c is formed using an In—Ga—Zn-oxide having an atomic ratio of In to Ga and Zn which is 1:3:2, and the third oxide layer 308d is formed using an In—Ga—Zn-oxide having an atomic ratio of In to Ga and Zn which is 1:6:4. Note that the structure of the oxide stack 308 is not limited to this, and for example, an In—Ga—Zn-oxide having an atomic ratio of In to Ga and Zn which is 1:6:4 may be used as the second oxide layer 308c and an In—Ga—Zn-oxide having an atomic ratio of In to Ga and Zn which is 1:9:6 may be used as the third oxide layer 308d.

The thickness of the third oxide layer 308d is greater than or equal to 3 nm and less than or equal to 100 nm, preferably greater than or equal to 3 nm and less than or equal to 50 nm.

As described above, the transistor according to one embodiment of the present invention has a plurality of gate electrode layers, so that the threshold voltage of the transistor is controlled and thus a so-called normally-off switching element can be achieved. Further, a semiconductor device including the transistor can be provided.

This embodiment can be freely combined with any of the other embodiments in this specification.

(Embodiment 5)

In this embodiment, an example of a semiconductor memory device is described as an example of the semiconductor device in the above embodiment.

An example of a semiconductor device in this embodiment includes a memory cell array including a plurality of memory cells that can store two or more bits of data.

The memory cell array in the semiconductor device in this embodiment is described with reference to FIGS. 11A to 11C.

FIG. 11A shows an example of a circuit configuration of the memory cell array in this embodiment. The memory cell array illustrated in FIG. 11A includes a plurality of memory cells 300, a plurality of bit lines BL, a plurality of word lines WL (including a word line WL_1 and a word line WL_2), a plurality of capacitor lines CL (including a capacitor line CL_1 and a capacitor line CL_2), a source line SL, and a plurality of gate lines SGL (including a gate line SGL_a and a gate line SGL_b). Although the example in FIG. 11A illustrates two memory cells, this is a non-limiting example and memory cell arrays should be placed in matrix.

The potentials of the plurality of bit lines BL are each controlled by, for example, a driver circuit including a decoder. The potentials of the plurality of word lines WL are each controlled by, for example, a driver circuit including a decoder. The potentials of the plurality of capacitor lines CL are each controlled by, for example, a driver circuit including a decoder. A constant potential, for example, is supplied to the source line SL. A signal or a constant potential, for example, is supplied to each of the plurality of gate lines SGL. Note that the same signal or the same constant potential may be supplied to each of the plurality of gate lines SGL. When a signal is input into each of the plurality of gate lines SGL, the potentials of the plurality of gate lines SGL are controlled by a driver circuit using, e.g., a decoder.

The memory cell 300 includes a plurality of submemory cells 301 (including a submemory cell 301_1 and a submemory cell 301_2).

The plurality of submemory cells 301 each have a function of storing one or more bit(s) of data. The plurality of submemory cells 301 can have a function of storing multiple bits of data. For example, four kinds of potentials are used as the potentials for the bit line BL, and thus the number of bits of data that can be stored in one submemory cell can be increased.

Each of the submemory cells 301 includes a transistor 311, a capacitor 312, and a transistor 313.

A source of the transistor 311 is electrically connected to one of the plurality of bit lines BL. The transistor 311 serves as a selection transistor for determining whether or not data is written. For the transistors 311, the semiconductor device described in any of Embodiments described above can be used.

In this case, in one memory cell 300, the transistors 311 included in the plurality of submemory cells 301 are formed using the same oxide semiconductor layer or the same oxide stack. For example, the same oxide semiconductor layer is used for the transistors 311 in the submemory cell 301_1 and the transistor 311 in the submemory cell 301_2.

The threshold voltages of the transistors 311 included in the plurality of submemory cells 301 are controlled by the plurality of gate lines SGL. For example, in FIG. 11A, the threshold voltages of the transistor 311 in the submemory cell 301_1 and the transistor 311 in the submemory cell 301_2 are controlled by the gate line SGL_a and the gate line SGL_b.

In this manner, the same gate lines SGL are used in common for the plurality of submemory cells 301, and thus the number of the gate lines SGL can be reduced as compared with a case where a gate line SGL is provided for each submemory cell 301.

One of a pair of electrodes of the capacitor 312 is electrically connected to a drain of the transistor 311, and the other thereof is electrically connected to one of the plurality of capacitor lines CL. The capacitor 312 serves as storage capacitors for holding data.

A gate of the transistor 313 is electrically connected to the drain of the transistor 311, one of a source and a drain of the transistor 313 is electrically connected to one of the plurality of bit lines BL, and the other thereof is electrically connected to the source line SL. Note that the transistor 313 serves as an output transistor which sets a value of data to be output.

That is the description of the circuit configuration example of the memory cell array illustrated in FIG. 11A.

Further, an example of a method for driving the memory cell array in FIG. 11A is described with reference to FIGS. 11B and 11C. FIGS. 11B and 11C are timing charts illustrating an example of a method for driving the memory cell array in FIG. 11A. Here, an example where one bit of data is sequentially written to the submemory cell 301_1 and the submemory cell 301_2 and then the data written is read is described. In addition, the transistor 311 is an n-channel transistor, while the transistor 313 is a p-channel transistor.

First, when data is written to the submemory cell 301_1, the potential of the word line WL_1 is set to a potential VH to turn on the transistor 311 in the submemory cell 301_1 in a period T11. The potential VH is, for example, a potential higher than the reference potential (e.g., high power supply potential). The potential VH corresponds to a high level of potential.

In the submemory cell 301_1, when the transistor 311 is on, the gate potential of the transistor 313 becomes equal to the potential of the bit line BL. Thus, data is written to the submemory cell 301_1.

Next, in a period T12, the potential of the word line WL_1 is set to a potential VL to turn off the transistor 311 in the submemory cell 301_1, and the potential of the word line WL_2 is set to a potential VH to turn on the transistor 311 in the submemory cell 301_2. The potential VL is, for example, a potential lower than or equal to the reference potential. The potential VL corresponds to a low level of potential.

In the submemory cell 301_2, when the transistor 311 is on, the gate potential of the transistor 313 becomes equal to the potential of the bit line BL. Thus, data is written to the submemory cell 301_2.

Through the above steps, two bits of data is written to the memory cell 300.

After that, in a period T13, the potentials of the word line WL_1 and the word line WL_2 are set to the potential VL to turn off the transistors 311 in the submemory cell 301_1 and the submemory cell 301_2. Thus, written data is held.

In addition, during the period from T11 to T13, the potentials of the gate line SGL_a and the gate line SGL_b are set to a potential VL2. The potential VL2 is a negative potential. The potentials of the gate line SGL_a and the gate line SGL_b are set to the potential VL2, so that the threshold voltages of the transistors 311 in the submemory cell 301_1 and the submemory cell 301_2 shift in the positive direction. Thus, leakage current of the transistors 311 in the submemory cell 301_1 and the submemory cell 301_2 can be reduced.

Gates of the transistors 313 in the submemory cell 301_1 and the submemory cell 301_2 are in floating states at this time, and thus electric charge accumulated in the gates of the transistors 313 are held for a certain period.

In addition, when the above-described operation is performed for the memory cells 300 in each row, data can be written to all the memory cells 300.

Further, when data is read out from the memory cell 300, in a period T21, the potentials of the word line WL_1 and the word line WL_2 are set to the potential VL, and thereby the transistors 311 in the submemory cell 301_1 and the submemory cell 301_2 are turned off. In addition, the potential of the capacitor line CL_1 is set to the potential VL, while the potential of the capacitor line CL_2 is set to the potential VH.

At this time, in the submemory cell 301_1, the resistance of the transistor 313 depends on the gate potential of the transistor 313. Accordingly, a potential corresponding to a value of current flowing between the source and the drain of the transistor 313 can be read out as data from the submemory cell 301_1 via the bit line BL.

Next, in a period T22, the potentials of the word line WL_1 and the word line WL_2 are set to the potential VL, so that the transistors 311 in the submemory cell 301_1 and submemory cell 301_2 remain off. In addition, the potential of the capacitor line CL_1 is set to the potential VH, while the potential of the capacitor line CL_2 is set to the potential VL.

At this time, in the submemory cell 301_2, a potential corresponding to a value of current flowing between the source and the drain of the transistor 313 can be read out as data from the submemory cell 301_1 via the bit line BL.

Further, when the above-described operation is repeatedly performed for the memory cells 300 in each row, the data can be read from all the memory cells 300.

That is description of the example of the method for driving the semiconductor device illustrated in FIG. 11A.

Note that, as illustrated in FIG. 12, a configuration may be employed, in which no transistor 313 is provided in each submemory cell 301.

In this case, a memory cell array illustrated in FIG. 12 includes a capacitor line CL2 instead of the plurality of capacitor lines CL. In addition, no source line SL is provided.

A constant potential is supplied to the capacitor line CL2.

In addition, one of a pair of electrodes of the capacitor 312 is electrically connected to the drain of the transistor 311, and the other thereof is electrically connected to the capacitor line CL2

In the memory cell illustrated in FIG. 12, in a data writing period, the potentials of the word lines WL are sequentially set to the potential VH for the submemory cells 301 to turn on the transistors 311, so that data can be rewritten via the bit line BL. In addition, in a data reading period, the potential of the bit line is set to a reading potential or floating in advance, and the potentials of the word lines WL are sequentially set to the potential VH for submemory cells 301 to turn on the transistors 311, so that data can be read out via the bit line BL. Further, when the potential of the bit line BL is compared with a predetermined potential, data can be read out from the memory cell 300.

At this time, with use of a transistor with low off-state current as the transistor 311, electric charge accumulated in one of the pair of electrodes of the capacitor 312 can be held for a long period when the transistor 311 is off.

Thus, the memory cell illustrated in FIG. 12 can hold electric charge accumulated in the capacitor 312 for a long time, since the off-state current of the transistor 311 is extremely low. In other words, power consumption can be adequately reduced because refresh operation becomes unnecessary or the frequency of refresh operation can be extremely low. Moreover, stored data can be held for a long time even when power is not supplied.

Figure 13A:
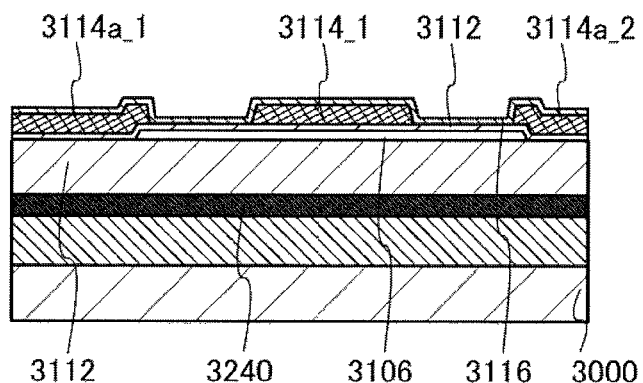
FIGS. 13A to 13C each illustrate an example of a structure of a memory cell.
Figure 13B:
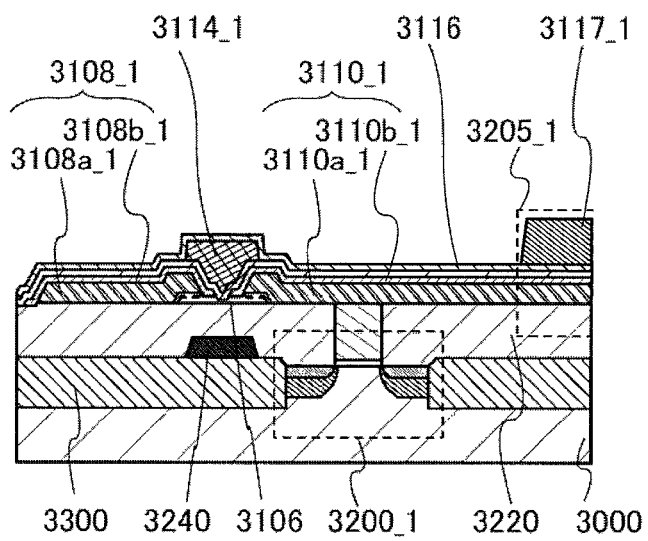
Figure 13C:
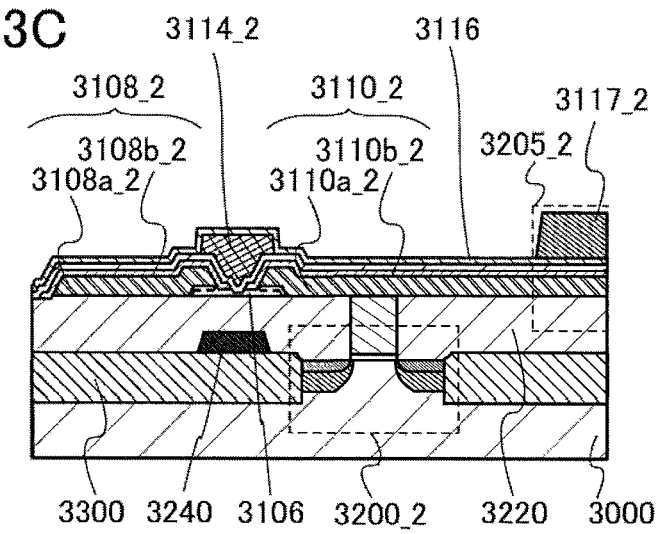

Next, a structural example of the memory cell 300 illustrated in FIGS. 11A to 11C will be described with reference to FIGS. 13A to 13C. FIG. 13A is a cross-sectional view of the memory cell in a channel width direction of the transistor 311. FIG. 13B is a cross-sectional view of the memory cell in a channel length direction of the transistor 311. FIG. 13C is a cross-sectional view of the memory cell in a channel length direction of the transistor 311, which illustrates a part different from FIG. 13B.

The memory cell illustrated in FIGS. 13A to 13C includes a transistor 3200_1 and a transistor 3200_2 formed using a first semiconductor material in its lower portion, and includes a transistor formed using a second semiconductor material, a capacitor 3205_1, and a capacitor 3205_2 in its upper portion.

Here, the first semiconductor material and the second semiconductor material preferably have different band gaps. For example, the first semiconductor material may be a semiconductor material (such as silicon) other than an oxide semiconductor, and the second semiconductor material may be an oxide semiconductor including an oxide semiconductor material. A transistor including, for example, crystalline silicon as a material other than an oxide semiconductor can operate at high speed easily. On the other hand, a transistor including an oxide semiconductor enables electric charge to be stored for a long time because it has low off-state current.

The transistor 3200_1 and the transistor 32002 in FIGS. 13A to 13C each include a channel formation region provided in the substrate 3000 including a semiconductor material (such as crystalline silicon), impurity regions provided such that the channel formation region is sandwiched therebetween, intermetallic compound regions provided in contact with the impurity regions, a gate insulating film provided over the channel formation region, and a gate electrode layer provided over the gate insulating film. Note that a transistor having a source electrode layer or a drain electrode layer not explicitly illustrated in the drawing may be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode layer" may include a source region.

Further, an element isolation insulating layer 3300 is formed on the substrate 3000 so as to surround the transistor 3200_1 or the transistor 3200_2, and a first insulating film 3220 is formed so as to cover the transistor 3200_1 or the transistor 3200_2. Note that the element isolation insulating layer 3300 can be formed by an element isolation technique such as local oxidation of silicon (LOCOS) or shallow trench isolation (STI). In addition, over the element isolation insulating layer 3300, a gate electrode layer 3240 serving as a backgate electrode of the above transistor using the second semiconductor material is provided.

For example, the transistor 3200_1 or the transistor 3200_2 formed using a crystalline silicon substrate can operate at high speed. With the use of the transistors as output transistors, data can be read at high speed. Accordingly, the transistor 3200_1 and the transistor 32002 correspond to the transistor 313 in the submemory cell 301_1 and the transistor 313 in the submemory cell 3012 illustrated in FIG. 11A, respectively, for example.

In addition, as treatment prior to formation of the transistor, the capacitor 3205_1, and the capacitor 3205_2 in the upper portion, CMP treatment is performed on the oxide insulating film 3220 covering the transistor 3200_1 or the transistor 3200_2, whereby the oxide insulating film 3220 is planarized and, at the same time, upper surfaces of the gate electrode layer of the transistor 3200_1 and transistor 3200_2 are exposed.

Further, the memory cell includes an oxide semiconductor layer 3106 formed over the first insulating film 3220, a source electrode layer 3108_1 (a source electrode layer 3108a_1 and a source electrode layer 3108b_1) provided in contact with the oxide semiconductor layer 3106, a source electrode layer 3108_2 (a source electrode layer 3108a_2 and a source electrode layer 3108b_2) provided in contact with the oxide semiconductor layer 3106, a drain electrode layer 3110_1 (a drain electrode layer 3110a_1 and a drain electrode layer 3110b_1) provided in contact with the oxide semiconductor layer 3106, a drain electrode layer 3110_2 (a drain electrode layer 3110a_2 and a drain electrode layer 3110b2) provided in contact with the oxide semiconductor layer 3106, a second insulating film 3112 provided over the oxide semiconductor layer 3106, the source electrode layer 3108a 1, the source electrode layer 3108a 2, the drain electrode layer 3110_1, and the drain electrode layer 3110_2, a gate electrode layer 3114_1 and a gate electrode layer 3114_2 provided over the second insulating film 3112, a gate electrode layer 3114a_1 and a gate electrode layer 3114a_2 overlapping with the side surface of the oxide semiconductor layer 3106 with the second insulating film 3112 interposed therebetween, and a third insulating film 3116 provided over the gate electrode layer 3114_1, the gate electrode layer 3114_2, the gate electrode layer 3114a1, and the gate electrode layer 3114a_2.

Further, the memory cell includes a capacitor electrode layer 3117_1 overlapping with the drain electrode layer 3110_1 with the third insulating film 3116 interposed therebetween and a capacitor electrode layer 3117_2 overlapping with the drain electrode layer 3110_2 with the third insulating film 3116 interposed therebetween.

The gate electrode layer 3240 corresponds to, for example, the first gate electrode layer 104 shown in FIGS. 1A to 1C. A layer formed of a material which can be used for the first gate electrode layer 104 can be used as the gate electrode layer 3240.

The oxide semiconductor layer 3106 corresponds to the oxide semiconductor layer 108 illustrated in FIGS. 1A to 1C, for example. As the oxide semiconductor layer 3108, a layer whose material is applicable to the oxide semiconductor layer 108 can be used.

The source electrode layers 3108_1 and 3108_2 correspond to, for example, the source electrode layer 110 shown in FIGS. 1A to 1C. The drain electrode layers 3110_1 and 3110_2 correspond to, for example, the drain electrode layer 112 shown in FIGS. 1A to 1C. As the source electrode layers 3108_1 and 3108_2, a layer whose material is applicable to the source electrode layer 110 can be used. As the drain electrode layers 3110_1 and 3110_2, a layer whose material is applicable to the drain electrode layer 112 can be used.

In addition, the drain electrode layer 3110_1 is in contact with the gate electrode layer of the transistor 3200_1 serving as the output transistor. Thus, in accordance with the potential of the gate electrode layer 3114_1, electric charge accumulated in the gate electrode layer of the transistor 3200_1 can be held as first data. In addition, the drain electrode layer 3110_2 is in contact with the gate electrode layer of the transistor 3200_2 serving as the output transistor. Thus, in accordance with the potential of the gate electrode layer 31142, electric charge accumulated in the gate electrode layer of the transistor 3200_2 can be held as second data. As described above, the first and the second data can be two or more bits of data.

The source electrode layer 3108_1 serves as the source of the transistor 311 in the submemory cell 301_1 illustrated in FIG. 11A to 11C. Further, the source electrode layer 3108_1 may be connected to another wiring layer serving as the bit line BL.

The source electrode layer 31082 serves as the source of the transistor 311 in the submemory cell 3012 illustrated in FIGS. 11A to 11C. Further, the source electrode layer 31082 may be connected to another wiring layer serving as the bit line BL.

The drain electrode layer 3110_1 serves as the drain of the transistor 311 in the submemory cell 301_1 illustrated in FIGS. 11A to 11C.

The drain electrode layer 3110_2 serves as the drain of the transistor 311 in the submemory cell 301_2 illustrated in FIGS. 11A to 11C.

The second insulating film 3112 corresponds to, for example, the second insulating film 114 illustrated in FIGS. 1A to 1C. The second insulating film 3112 can be, for example, a layer of a material which can be used for the second insulating film 114.

The gate electrode layer 3240 corresponds to, for example, the first gate insulating layer 104 illustrated in FIGS. 1A to 1C. The gate electrode layers 3114_1 and 31142 correspond to, for example, the second gate electrode layer 116 illustrated in FIGS. 1A to 1C. The gate electrode layers 3114a_1 and 3114a 2 respectively correspond to, for example, the third gate electrode layers 118a and 118b illustrated in FIGS. 1A to 1C.

The gate electrode layer 3114_1 serves as the gate of the transistor 311 in the submemory cell 301_1 illustrated in FIGS. 11A to 11C. Further, the gate electrode layer 3114_1 may be electrically connected to another wiring layer serving as the word line WL_1.

The gate electrode layer 3114_2 serves as the gate of the transistor 311 in the submemory cell 301_2 illustrated in FIGS. 11A to 11C. Further, the gate electrode layer 3114a_2 may be electrically connected to another wiring layer serving as the word line WL_2.

The third insulating film 3116 corresponds to, for example, the third insulating film 3116 illustrated in FIGS. 1A to 1C. A layer of a material applicapable to the third insulating film 3116 can be used for the third insulating film 120.

Layers of materials applicapable to the drain electrode layer 3110_1 and the drain electrode layer 31102, for example, can be used for the capacitor electrode layer 3117_1 and the capacitor electrode layer 3117_2.

In FIGS. 13A to 13C, the capacitor 3205_1 includes the drain electrode layer 3110_1, the third insulating film 3116, and the capacitor electrode layer 3117_1. The capacitor 3205_1 corresponds to the capacitor 312 of the submemory cell 301_1 illustrated in FIGS. 11A to 11C.

In FIG. 13A to FIG. 13C, the capacitor 3205_2 includes the drain electrode layer 3110_2, the third insulating film 3116, and the capacitor electrode layer 3117_2. The capacitor 3205_2 corresponds to the capacitor 312 of the submemory cell 301_2 illustrated in FIGS. 11A to 11C.

Further, the capacitor electrode layer 3117_1 may be electrically connected to another wiring layer serving as the capacitor line CL_1. Further, the capacitor electrode layer 3117_2 may be electrically connected to another wiring layer serving as the capacitor line CL_2.

Since the off-state current of the transistor including a second oxide semiconductor material and illustrated in FIG. 13A is low, stored data can be held for a long time owing to such a transistor. In other words, power consumption can be sufficiently reduced because a semiconductor device in which refresh operation is unnecessary or the frequency of refresh operation is extremely low can be provided.

As illustrated in FIGS. 13B and 13C, the transistor 3200_1 and the transistor 32002 can be formed to overlap with the transistor using the second semiconductor material; therefore, the area occupied by these transistors can be reduced. Accordingly, the degree of integration of the semiconductor device can be increased.

That is the description of the semiconductor device of this embodiment.

In addition, in an example of the semiconductor device in this embodiment, a field-effect transistor with low off-state current is used as a selection transistor, whereby a data retention period can be lengthened. Therefore, the power consumption can be reduced.

Further, in an example of a semiconductor device in this embodiment, another gate electrode layer is overlapped with the side surface of the oxide semiconductor layer of each transistor, so that the threshold voltages of the plurality of transistors can be controlled. In addition, it is not necessary to provide a gate electrode layer controlling the threshold voltage of the selection transistor for each submemory cell, and thus the number of wirings can be reduced.

This embodiment can be freely combined with any of the other embodiments in this specification.

(Embodiment 6)

In this embodiment, examples of an electronic appliance and an electronic device which can use any of the semiconductor devices described in Embodiments 1 to 5 will be described.

Any of the semiconductor devices described in Embodiments 1 to 5 can be applied to a variety of electronic appliances (including game machines) and electronic devices. Examples of the electronic appliances include display devices of televisions, monitors, and the like, lighting devices, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, mobile phones, car phones, portable game machines, calculators, portable information terminals, electronic notebooks, e-book readers, electronic translators, audio input devices, cameras such as video cameras and digital still cameras, electric shavers, and IC chips. Examples of the electronic devices include high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers. In addition, the examples of the electronic devices include alarm devices such as smoke detectors, gas alarm devices, and security alarm devices. Further, the examples also include industrial equipment such as guide lights, traffic lights, belt conveyors, elevators, escalators, industrial robots, and power storage systems. In addition, moving objects and the like driven by oil engines and electric motors using power from the non-aqueous secondary batteries, and the like are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic appliances and electronic devices are illustrated in FIG. 14, FIGS. 15A to 15C, and FIGS. 16A to 16C.

First, as an example of the alarm device, a structure of a fire alarm is described with reference to FIG. 14. A fire alarm in this specification refers to any device which raises an alarm over fire occurrence instantly, and for example, a residential fire alarm, an automatic fire alarm system, and a fire detector used for the automatic fire alarm system are included in its category.

Figure 14:
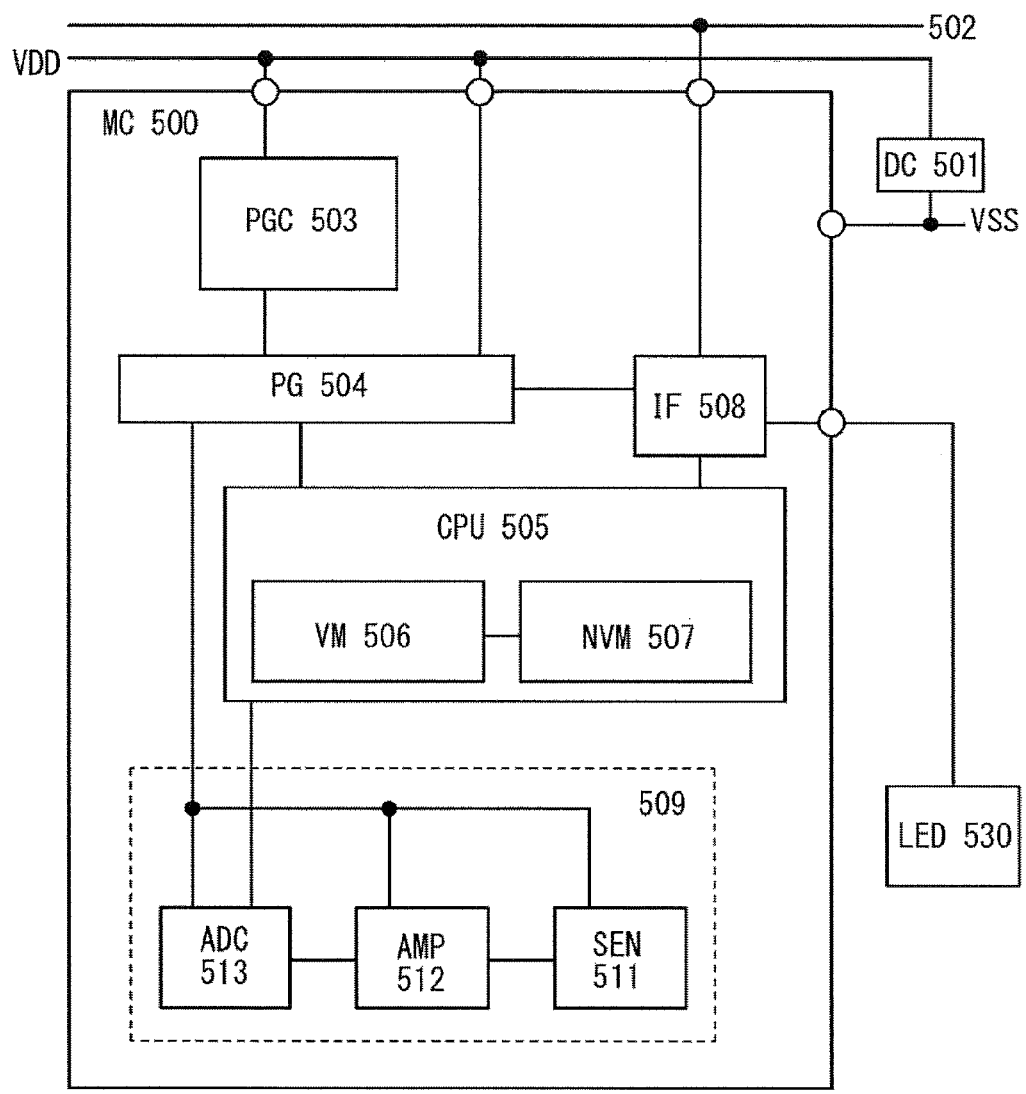
FIG. 14 is a block diagram of a semiconductor device.

The alarm device illustrated in FIG. 14 includes at least a microcomputer 500. Here, the microcomputer 500 is provided in the alarm device. The microcomputer 500 includes a power gate controller 503 electrically connected to a high potential power supply line VDD, a power gate 504 electrically connected to the high potential power supply line VDD and the power gate controller 503, a central processing unit (CPU) 505 electrically connected to the power gate 504, and a sensor portion 509 electrically connected to the power gate 504 and the CPU 505. Further, the CPU 505 includes a volatile memory portion 506 and a nonvolatile memory portion 507.

The microcomputer 500 illustrated in FIG. 14 can use the semiconductor device in any of the above-described embodiments for the volatile memory portion 506 of the CPU 505.

The CPU 505 is electrically connected to a bus line 502 through an interface 508. The interface 508 as well as the CPU 505 is electrically connected to the power gate 504. As a bus standard of the interface 508, an I²C bus can be used, for example. A light-emitting element 530 electrically connected to the power gate 504 through the interface 508 is provided in the alarm device described in this embodiment.

The light-emitting element 530 is preferably an element which emits light with high directivity, and for example, an organic EL element, an inorganic EL element, or a light-emitting diode (LED) can be used.

The power gate controller 503 includes a timer and controls the power gate 504 with the timer. The power gate 504 allows or stops supply of power from the high potential power supply line VDD to the CPU 505, the sensor portion 509, and the interface 508, in accordance with the control by the power gate controller 503. Here, as an example of the power gate 504, a switching element such as a transistor can be given.

With the use of the power gate controller 503 and the power gate 504, power is supplied to the sensor portion 509, the CPU 505, and the interface 508 in a period during which the amount of light is measured, and supply of power to the sensor portion 509, the CPU 505, and the interface 508 can be stopped during an interval between measurement periods. The alarm device operates in such a manner, whereby power consumption can be reduced compared with a case where power is continuously supplied to the above structures.

When a transistor is used as the power gate 504, it is preferable to use a transistor which has an extremely low off-state current and is used for the nonvolatile memory portion 507, for example, a transistor including an oxide semiconductor. With the use of such a transistor, leakage current can be reduced when supply of power is stopped by the power gate 504, so that a reduction in power consumption of the alarm device can be achieved.

A direct-current power source 501 can be provided in the alarm device described in this embodiment so that power is supplied from the direct-current power source 501 to the high potential power supply line VDD. An electrode of the direct-current power source 501 on a high potential side is electrically connected to the high potential power supply line VDD, and an electrode of the direct-current power source 501 on a low potential side is electrically connected to a low potential power supply line VSS. The low potential power supply line VSS is electrically connected to the microcomputer 500. Here, the high potential power supply line VDD is supplied with a high potential H. The low potential power supply line VSS is supplied with a low potential L, e.g., a ground potential (GND).

When a battery is used as the direct-current power source 501, for example, a battery case including an electrode electrically connected to the high potential power supply line VDD, an electrode electrically connected to the low potential power supply line VSS, and a housing which can hold the battery, is provided in a housing. Note that the alarm device described in this embodiment does not necessarily include the direct-current power source 501 and may have, for example, a structure in which power is supplied from an alternate-current power source provided outside the alarm device through a wiring.

As the above battery, a secondary battery such as a lithium ion secondary battery (also called a lithium ion storage battery or a lithium ion battery) can be used. Further, a solar battery is preferably provided to charge the secondary battery.

The sensor portion 509 measures a physical quantity relating to an abnormal situation and transmits a measured value to the CPU 505. The physical quantity relating to an abnormal situation depends on the usage of the alarm device, and in an alarm device functioning as a fire alarm, a physical quantity relating to a fire is measured. Accordingly, the sensor portion 509 measures the amount of light as the physical quantity relating to a fire and senses smoke.

The sensor portion 509 includes an optical sensor 511 electrically connected to the power gate 504, an amplifier 512 electrically connected to the power gate 504, and an AD converter 513 electrically connected to the power gate 504 and the CPU 505. The optical sensor 511, the amplifier 512, and the AD converter 513 which are provided in the sensor portion 509, and the light-emitting element 530 operate when the power gate 504 allows supply of power to the sensor portion 509.

In the above manner, the sensor portion 509 including the optical sensor 511 can be incorporated into the microcomputer 500, so that the number of components can be reduced and the housing of the alarm device can be reduced. Note that for free circuit layout of the optical sensor or the photoelectric conversion element, the optical sensor or the photoelectric conversion element may be externally provided so as to be electrically connected to the microcomputer 500.

In the alarm device including the above-described IC chip, the CPU 505 in which a plurality of circuits including the semiconductor device described in any of the above embodiments are combined and mounted on one IC chip is used.

Figure 15A:
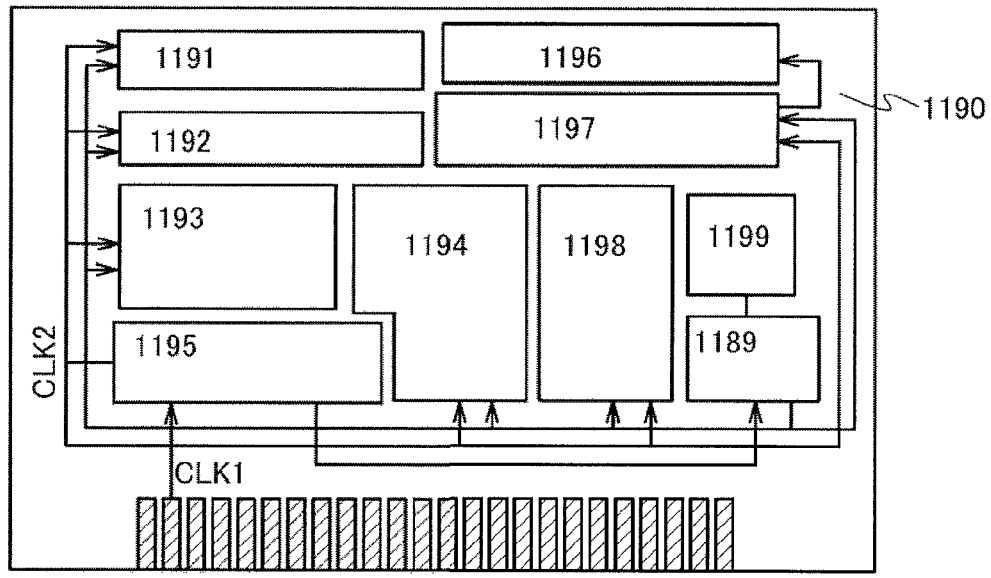
FIGS. 15A to 15C are block diagrams of a semiconductor device.
Figure 15B:
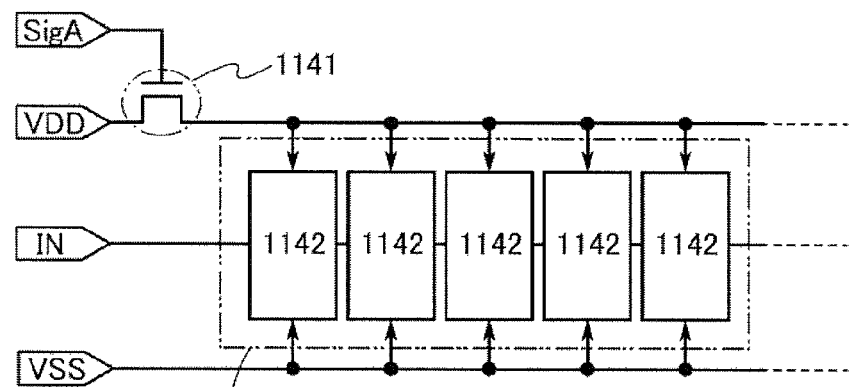
Figure 15C:
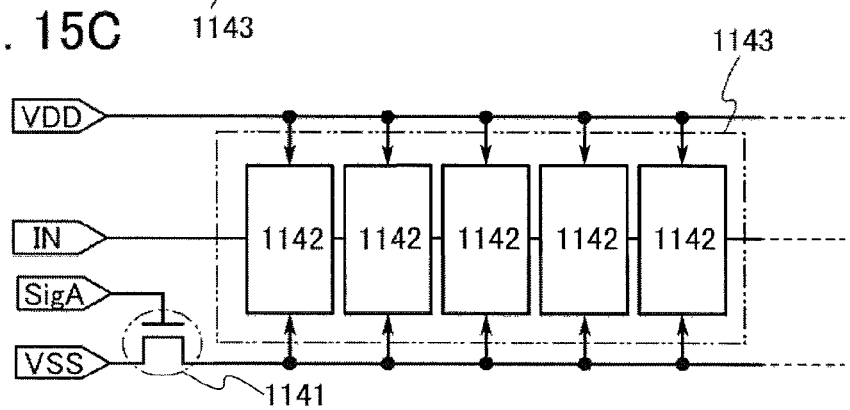

FIGS. 15A to 15C are block diagrams illustrating a specific configuration of a CPU at least partly including any of the semicondcutor devices described in Embodiments 1 to 5.

The CPU illustrated in FIG. 15A includes an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189 over a substrate 1190. A semiconductor substrate, an SOI substrate, a glass substrate, or the like is used as the substrate 1190. The ROM 1199 and the ROM interface 1189 may be provided over a separate chip. Needless to say, the CPU in FIG. 15A is one example in which the configuration is simplified, and an actual CPU may have a great variety of configurations depending on the application.

An instruction that is input to the CPU through the bus interface 1198 is input to the instruction decoder 1193 and decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates a signal for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 15A, a memory cell is provided in the register 1196. For the memory cell of the register 1196, any of the transistors described in the above embodiments can be used.

In the CPU illustrated in FIG. 15A, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

The power supply can be stopped by a switching element provided between a memory cell group and a node to which a power supply potential VDD or a power supply potential VSS is supplied, as illustrated in FIG. 15B or FIG. 15C. Circuits illustrated in FIGS. 15B and 15C are described below.

FIGS. 15B and 15C each illustrate an example of the configuration of a memory circuit in which any of the transistors described in the above embodiments is used as a switching element which controls supply of a power supply potential to a memory cell.

The memory device illustrated in FIG. 15B includes a switching element 1141 and a memory cell group 1143 including a plurality of memory cells 1142. Specifically, for each of the memory cells 1142, any of the transistors described in the above embodiments can be used. Each of the memory cells 1142 included in the memory cell group 1143 is supplied with the high level power supply potential VDD via the switching element 1141. Further, each of the memory cells 1142 included in the memory cell group 1143 is supplied with a potential of a signal IN and the low level power supply potential VSS.

In FIG. 15B, any of the transistors described in the above embodiments is used as the switching element 1141, and the switching of the transistor is controlled by a signal SigA supplied to a gate electrode layer thereof.

Note that FIG. 15B illustrates the configuration in which the switching element 1141 includes only one transistor; however, without particular limitation, the switching element 1141 may include a plurality of transistors. In the case where the switching element 1141 includes a plurality of transistors which function as switching elements, the plurality of transistors may be connected to each other in parallel, in series, or in combination of parallel connection and series connection.

Although the switching element 1141 controls the supply of the high level power supply potential VDD to each of the memory cells 1142 included in the memory cell group 1143 in FIG. 15B, the switching element 1141 can control the supply of the low level power supply potential VSS.

FIG. 15C illustrates an example of a memory device in which each of the memory cells 1142 included in the memory cell group 1143 is supplied with the low level power supply potential VSS via the switching element 1141. The supply of the low level power supply potential VSS to each of the memory cells 1142 included in the memory cell group 1143 can be controlled by the switching element 1141.

Data can be held even when the switching element is provided between the memory cell group and a node to which the power supply potential VDD or the power supply potential VSS is supplied, an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

Figure 16A:
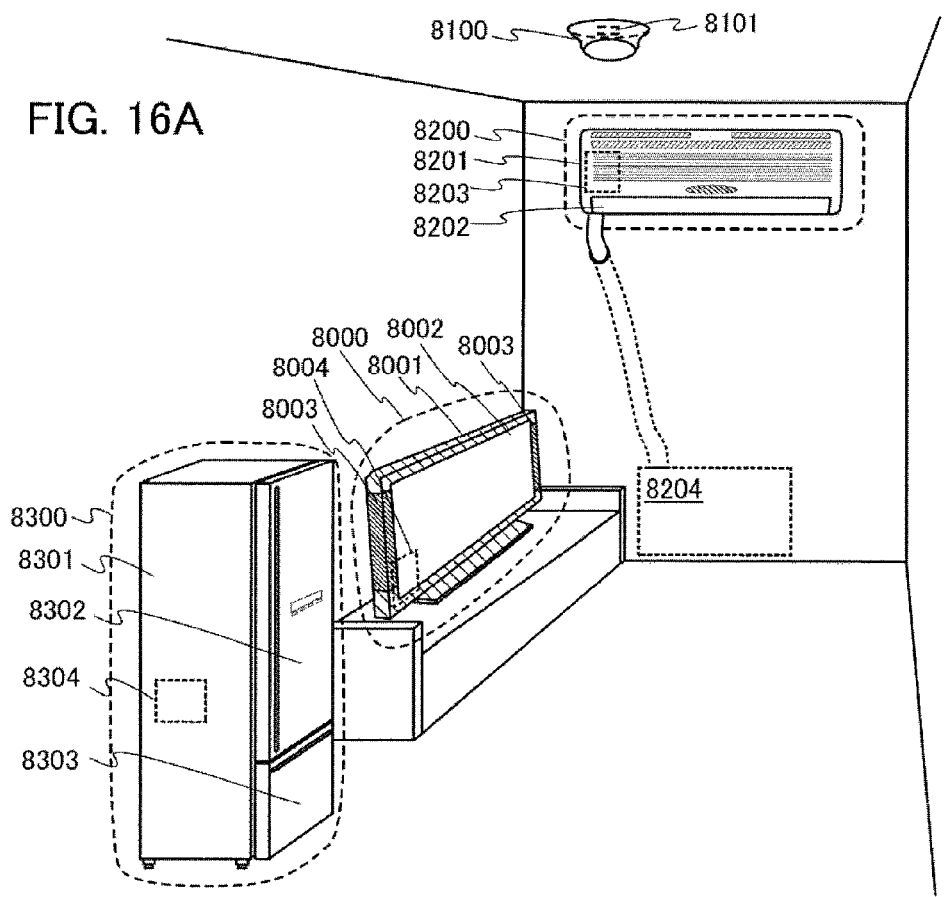
FIGS. 16A to 16C illustrate electronic appliances to which semiconductor devices can be applied.

In FIG. 16A, an alarm device 8100 is a residential fire alarm and is an example of an electronic device using a sensor portion and a microcomputer 8101. The microcomputer 8101 is an example of electronic devices each including a CPU in which any of the transistors described in the above embodiments is used.

In FIG. 16A, an air conditioner including an indoor unit 8200 and an outdoor unit 8204 is an example of electronic devices each including the CPU in which any of the transistors described in the above embodiments is used. Specifically, the indoor unit 8200 includes a housing 8201, an air outlet 8202, a CPU 8203, and the like. Although the CPU 8203 is provided in the indoor unit 8200 in FIG. 16A, the CPU 8203 may be provided in the outdoor unit 8204. Alternatively, the CPU 8203 may be provided in both the indoor unit 8200 and the outdoor unit 8204. By using any of the transistors described in the above embodiments as the CPU in the air conditioner, power consumption of the air conditioner can be reduced.

In FIG. 16A, an electric refrigerator-freezer 8300 is an example of an electronic device including the CPU in which any of the transistors described in the above embodiments is used. Specifically, the electric refrigerator-freezer 8300 includes a housing 8301, a door for a refrigerator 8302, a door for a freezer 8303, a CPU 8304, and the like. In FIG. 16A, the CPU 8304 is provided in the housing 8301. When any of the transistors described in the above embodiments is used as the CPU 8304 of the electric refrigerator-freezer 8300, power consumption of the electric refrigerator-freezer 8300 can be reduced.

Figure 16B:
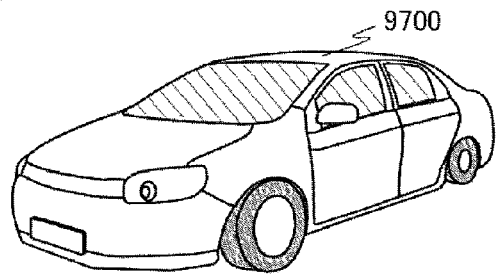
Figure 16C:
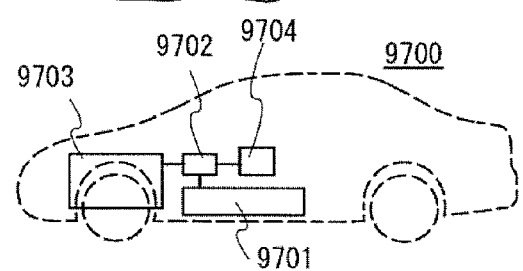

FIGS. 16B and 16C illustrate an example of an electric vehicle which is an example of such electronic devices. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When any of the transistors described in the above embodiments is used for the CPU in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in response to the control signal of the processing unit 9704 to control the output of the driving device 9703. When the AC motor is used, although not illustrated, an inverter which converts direct current into alternate current is also incorporated.

This embodiment can be freely combined with any of the other embodiments in this specification.

(Embodiment 7)

In order to improve reliability of a transistor including an oxide semiconductor (OS) layer, it is important to clarify a factor that affects the reliability. Here, in order to improve reliability of the transistor including an oxide semiconductor layer, the deterioration mechanism model described below was made.

Note that an oxygen vacancy of the oxide semiconductor layer forms a deep level DOS in the oxide semiconductor layer. In order to reduce density of the deep level DOS, it is important to make a state in which the oxide semiconductor layer contains oxygen in excess of the stoichiometric composition and to provide the oxide semiconductor layer to supply oxygen for repairing the oxygen vacancy from outside.

When a + gate BT (+GBT: + gate bias temperature) test is performed on the transistor including the oxide semiconductor layer, the threshold voltage (Vth) shifts in the positive direction as compared to the initial Vg-Id characteristics. In addition, when a − gate BT (−GBT: − gate bias temperature) test has been performed on the transistor on which a + gate BT test is performed, the threshold voltage (Vth) shifts in the negative direction. In this manner, the threshold voltage of the transistor becomes alternately positive and negative, which is associated with alternation of a + gate BT test and a − gate BT test (see FIG. 17).

Figure 17:
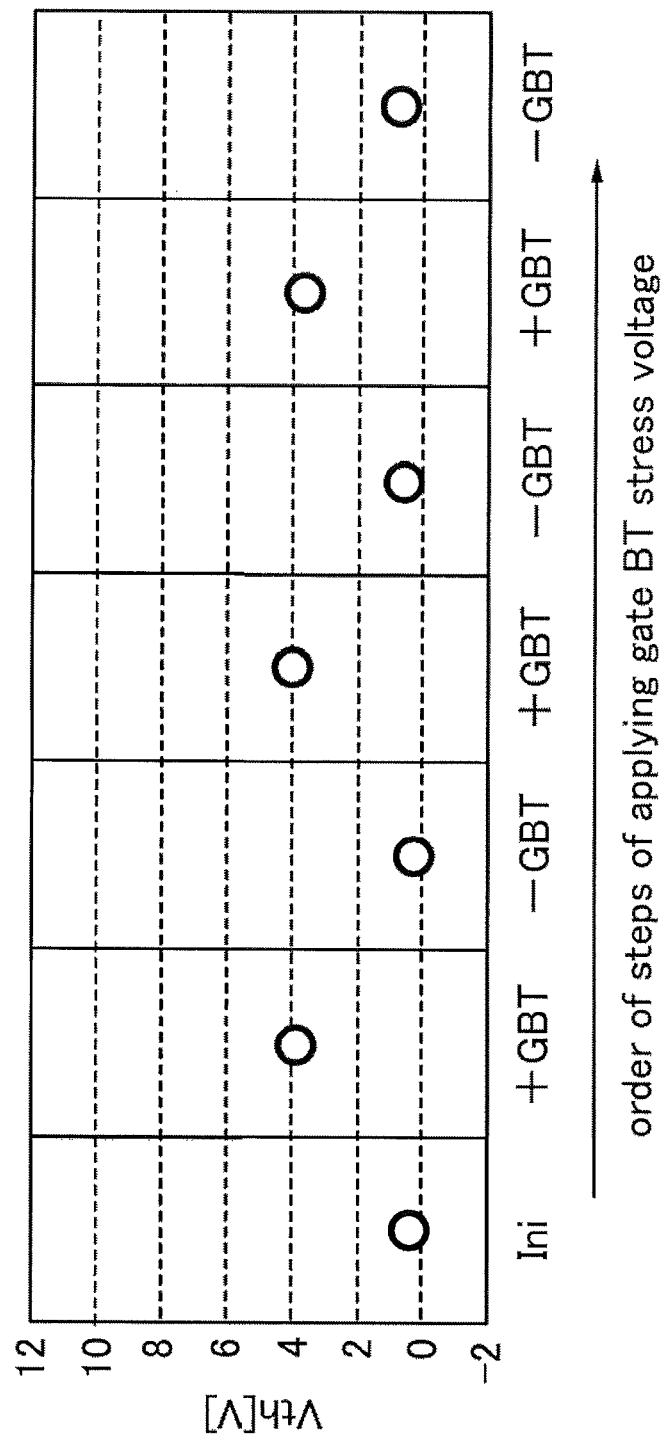
FIG. 17 illustrates a change of electric characteristics of a transistor including an oxide semiconductor layer.

FIG. 17 suggests that the change of Vg-Id characteristics of the transistor including the oxide semiconductor layer relates to not a fixed charge but a level (trap level).

Figure 18:
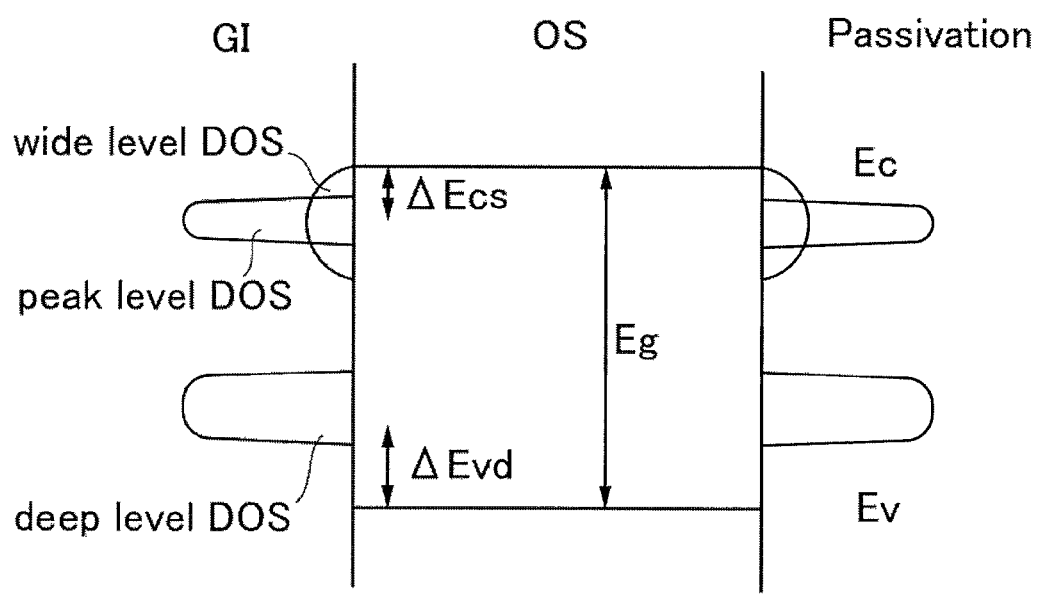
FIG. 18 is an energy band diagram of a transistor including an oxide semiconductor layer.

FIG. 18 is a model of an energy band diagram of the transistor including the oxide semiconductor layer. Note that FIG. 18 shows a state where a gate voltage is not applied. In FIG. 18, three kinds of defect levels (DOS) were assumed in the oxide semiconductor layer, at the interface between the oxide semiconductor layer and a gate insulating film ("GI"), and the interface between the oxide semiconductor layer and a protective insulating film ("Passivation"). As defect levels, there are two kinds of shallow level DOS and one kind of deep level DOS. Note that each of the defect levels has an energy distribution. Here, the first shallow level (wide level DOS) has a wide energy distribution, and the second shallow level (peak level DOS) has a narrow energy distribution. In addition, a difference ($\Delta Evd$) between energy at the top of the valence band and energy of the deep level DOS is larger than a difference ($\Delta Ecs$) between energy at the bottom of the conduction band and energy of the peak level DOS.

For example, the shallow level becomes neutral when its energy is higher than Fermi energy and is negatively charged when its energy is lower than Fermi energy. On the other hand, the deep level is positively charged when the energy is larger than Fermi energy and becomes neutral when the energy is smaller than Fermi energy.

Figure 19A:
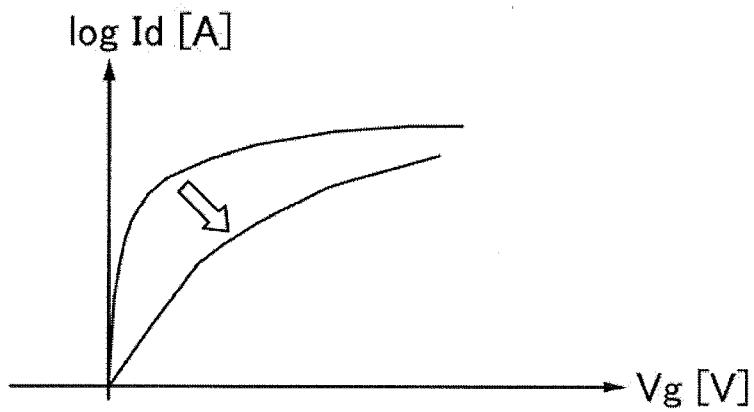
FIGS. 19A to 19C each show a deterioration mode of a transistor including an oxide semiconductor layer.
Figure 19B:
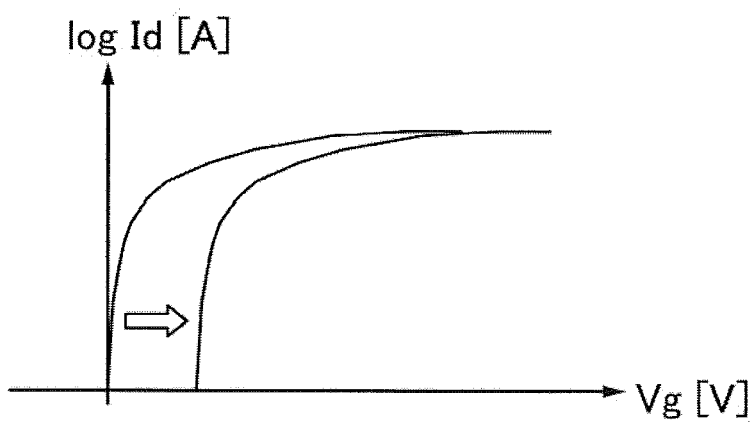
Figure 19C:
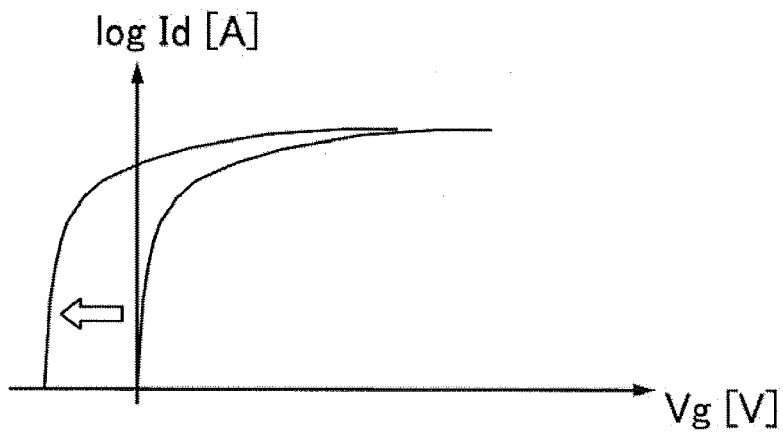

FIGS. 19A to 19C each show a deterioration mode of Vg-Id characteristics of the transistor including the oxide semiconductor layer. The transistor including the oxide semiconductor layer has three kinds of deterioration modes. Specifically, FIG. 19A shows a deterioration mode in which the on-state current is decreased, FIG. 19B shows a deterioration mode in which the threshold voltage shifts in the positive direction, and FIG. 19C shows a deterioration mode in which the threshold voltage shifts in the negative direction.

What types of defect levels cause such deterioration modes of the transistor including the oxide semiconductor layer will be explained below.

Figure 20A:
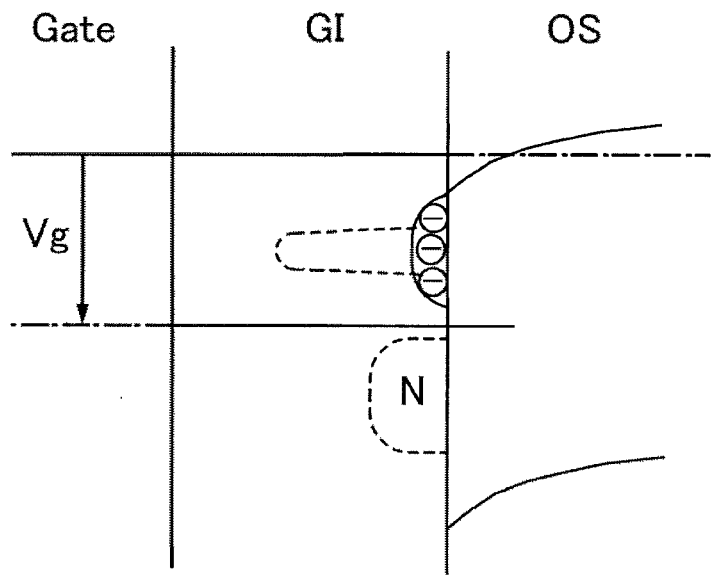
FIGS. 20A and 20B are an energy band diagram and a diagram showing the corresponding deterioration model of a transistor including an oxide semiconductor layer.
Figure 20B:
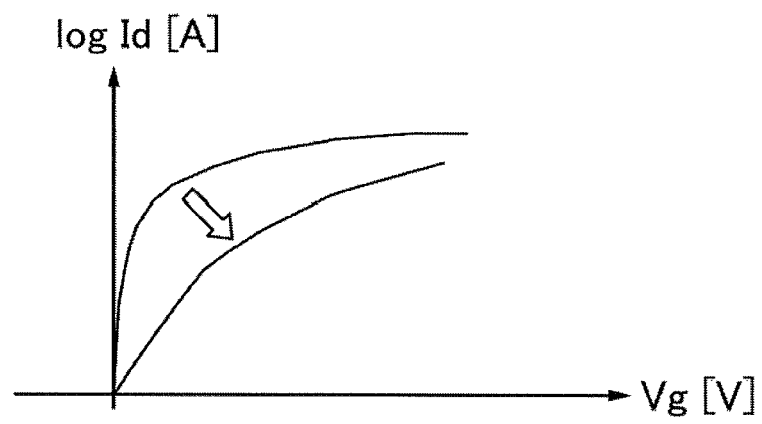

Firstly, the decrease of on-state current shown in FIG. 19A is explained. When Vg-Id characteristics are measured, as a gate voltage increases, electrons are trapped by the wide level DOS (see FIG. 20A). At this time, the trapped electrons do not contribute to electric conduction, so that the on-state current of the transistor is decreased, i.e., the line is crushed (see FIG. 20B). Therefore, the decrease of on-state current of the transistor, which is one of the deterioration modes, is probably caused due to the wide level DOS. Note that N in the figures means Neutral.

Next, the shift of the threshold voltage to the positive side when a + gate BT test is performed will be explained with reference to FIGS. 21A and 21B.

Figure 21A:
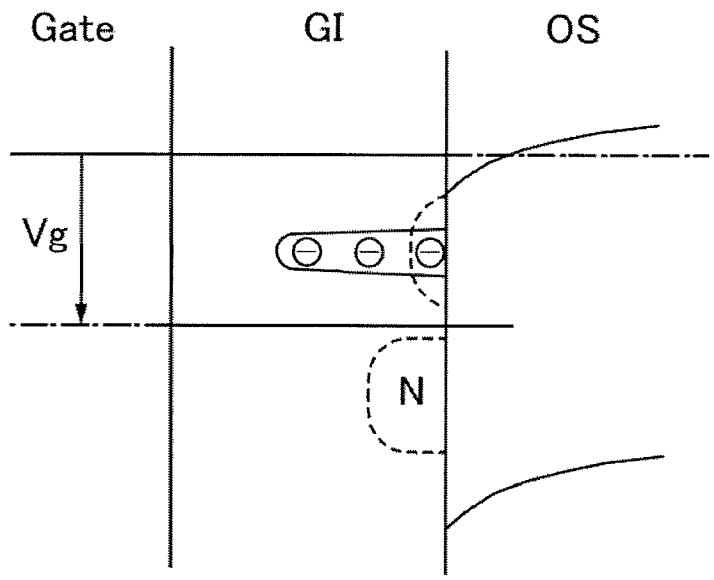
FIGS. 21A and 21B are an energy band diagram and a diagram showing the corresponding deterioration model of a transistor including an oxide semiconductor layer.
Figure 21B:
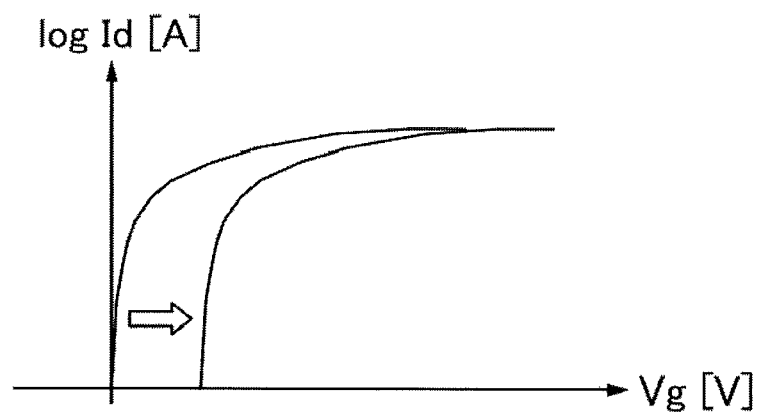

When a + gate BT test is performed, electrons induced by a positive gate voltage are trapped by the peak level DOS (see FIG. 21A). The electrons trapped at the time of the + gate BT test, i.e., negative charges, have a long relaxation time and thus behave like fixed charges. Due to the negative charges, even after the gate voltage (bias) is off, it can be considered that a negative voltage is effectively applied. Therefore, when the electric characteristics of the transistor are measured after the + gate BT test, the threshold voltage of the transistor characteristics (Vg-Id characteristics) shifts in the positive direction (see FIG. 21B).

Next, the shift of the threshold voltage to the negative side when a − gate BT test is performed will be explained with reference to FIGS. 22A and 22B.

Figure 22A:
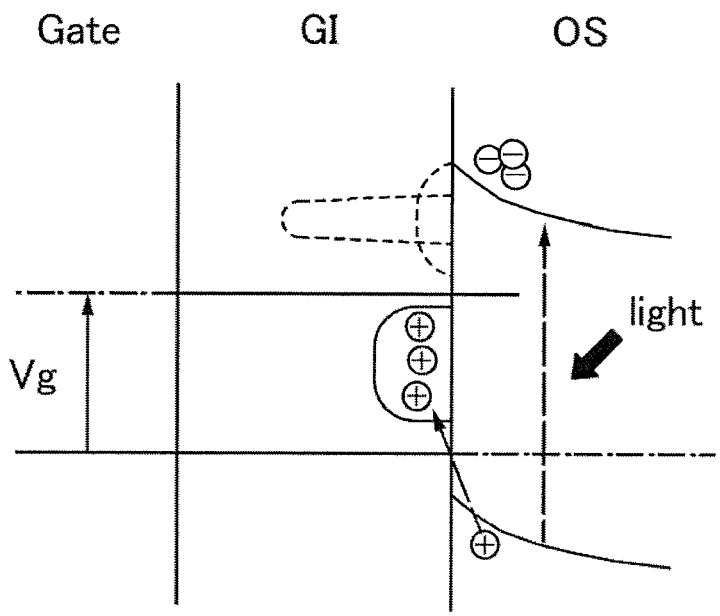
FIGS. 22A and 22B are an energy band diagram and a diagram showing the corresponding deterioration model of a transistor including an oxide semiconductor layer.
Figure 22B:
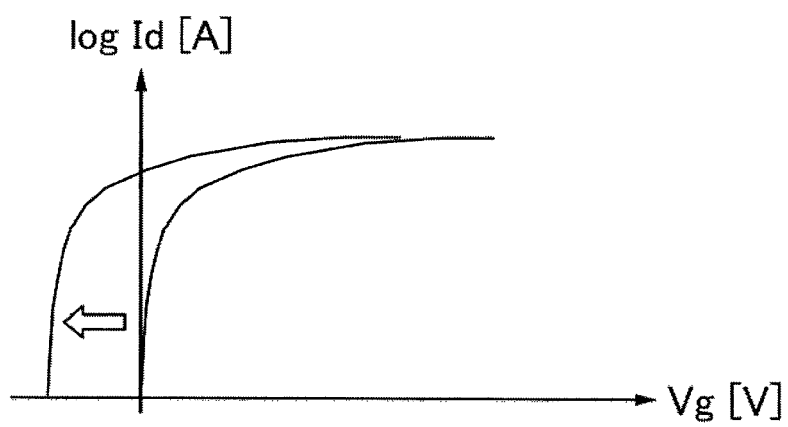

When a − gate voltage Vg is applied to the transistor and the transistor is irradiated with light in a − gate BT test, holes, that is, positive charges are trapped by the deep level DOS (see FIG. 22A). Since a difference between energy at the bottom of the conduction band (Ec) and energy of the deep level DOS is large and a difference between energy at the top of the valence band (Ev) and energy of the deep level DOS is large, it takes a long time before holes are induced. In addition, holes in the oxide semiconductor layer have a large effective mass, and holes are hardly injected even from a drain electrode. The positive charges have a long relaxation time and thus behave like a fixed charge. Due to the positive charges, even after the gate voltage (bias) is off, it can be considered that a positive voltage is effectively applied. Therefore, when the electric characteristics of the transistor are measured after the − gate BT test, the threshold voltage of the transistor characteristics (Vg-Id characteristics) shifts in the negative direction (see FIG. 22B).

Figure 23:
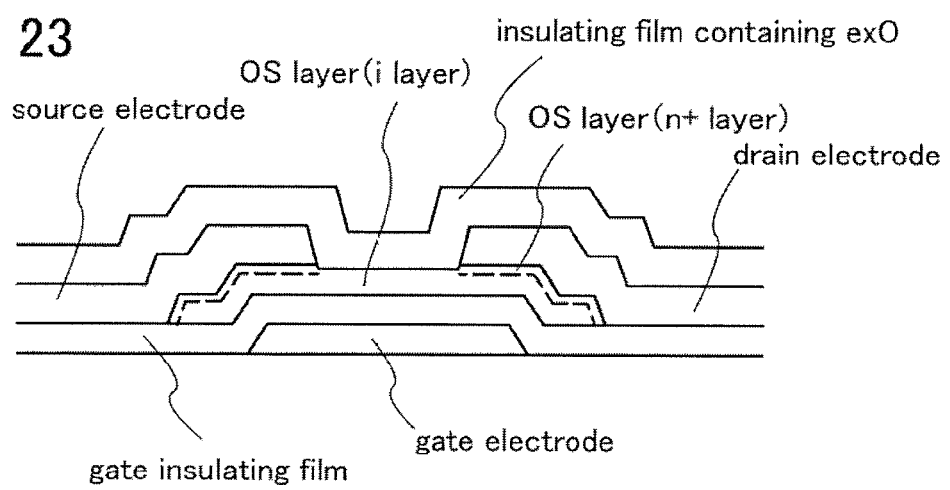
FIG. 23 is a cross-sectional view of a transistor including an oxide semiconductor layer.

Next, an n-type region in which an oxide semiconductor layer is in contact with a source electrode and a drain electrode will be described with reference to FIG. 23. FIG. 23 is a cross-sectional view of a transistor including an oxide semiconductor layer. The transistor includes a gate electrode, a gate insulating film formed over the gate electrode, an oxide semiconductor layer formed over the gate insulating film, a source electrode and a drain electrode formed over the oxide semiconductor layer, and an insulating film (excess oxygen (exO) containing insulating film) formed over the oxide semiconductor layer, the source electrode, and the drain electrode.

The oxide semiconductor layer is formed, and then the source electrode and the drain electrode are formed to be in contact with the oxide semiconductor layer. For example, when the source electrode and the drain electrode are formed by a sputtering method, plasma damage to the oxide semiconductor layer or collision of atoms or molecules of a material used for the source electrode and the drain electrode due to the sputtering makes part of the oxide semiconductor layer n-type, so that an n-type region ($n^+$ layer) is formed.

In addition, the n-type region is also formed by heat treatment after the source electrode and the drain electrode are formed. For example, by the heat treatment, hydrogen enters the position of an oxygen vacancy in the oxide semiconductor layer (VoH is formed) or In contained in the oxide semiconductor layer is reduced, so that the n-type region is formed.

On the other hand, in a region of the oxide semiconductor layer in which the source electrode and the drain electrode are not formed, i.e., a region where a channel is formed, an insulating film containing excess oxygen (exO) is formed to be in contact with the oxide semiconductor layer. Thus, by performing heat treatment after the insulating film containing excess oxygen is formed, oxygen vacancies are repaired by the excess oxygen (exO) in the oxide semiconductor layer and reduced, whereby the oxide semiconductor layer becomes i-type (i layer).

Note that when the oxide semiconductor layer is an In—Ga—Zn oxide, oxygen that is bonded to indium whose bond energy with oxygen is low is easily released (i.e., In-Vo is easily formed). Note that the peak level DOS is probably related to In-VoH and may form an n-type region. The wide level DOS and the deep level DOS are thought to be related to In-Vo-HO—Si and In-Vo-In, respectively.

In order to reduce the density of defect levels in an oxide semiconductor layer, it is important to reduce oxygen vacancies (Vo). Specifically, oxygen vacancies can be reduced by preventing entry of Si into the oxide semiconductor layer or by being repaired by excess oxygen. In addition, since VoH is contributed to formation of a shallow level which is a defect level, it is preferable to reduce hydrogen in the oxide semiconductor layer.

This application is based on Japanese Patent Application serial No. 2012-251701 filed with Japan Patent Office on Nov. 15, 2012 and Japanese Patent Application serial No. 2012-251860 filed with Japan Patent Office on Nov. 16, 2012, the entire contents of which are hereby incorporated by reference.

What is claimed is:

1. A semiconductor device comprising:
    a first gate electrode layer;
    a first insulating film over the first gate electrode layer;
    an oxide semiconductor layer comprising a channel formation region and overlapping the first gate electrode layer with the first insulating film therebetween;
    a source electrode layer and a drain electrode layer over and electrically connected to the oxide semiconductor layer;
    a second insulating film over the oxide semiconductor layer, the source electrode layer, and the drain electrode layer;
    a second gate electrode layer overlapping the channel formation region with the second insulating film therebetween;
    a third gate electrode layer over the second insulating film and overlapping a first end portion of the oxide semiconductor layer; and
    a fourth gate electrode layer over the second insulating film and overlapping a second end portion of the oxide semiconductor layer that is opposite the first end portion;
    wherein the third gate electrode layer and the fourth gate electrode layer each extend in a direction that intersects with a channel length direction of the channel formation region.

2. The semiconductor device according to claim 1, further comprising a second source electrode layer and a second drain electrode layer respectively over and in contact with the source electrode layer and the drain electrode layer,
    wherein a distance between the second source electrode layer and the second drain electrode layer is shorter than a distance between the source electrode layer and the drain electrode layer.

3. The semiconductor device according to claim 1, wherein the oxide semiconductor layer comprises In, Zn, and a metal selected from Al, Ga, Ge, Y, Zr, Sn, La, Ce, and Hf.

4. The semiconductor device according to claim 1, wherein a carrier density of the oxide semiconductor layer is lower than $1 \times 10^{17}$ $cm^3$.

5. The semiconductor device according to claim 1,
    wherein the second gate electrode layer is configured to control drive of the semiconductor device,
    wherein the first, third and fourth gate electrode layers are configured to control threshold voltage of the semiconductor device, and
    wherein a potential supplied to the first gate electrode layer is different from that supplied to the third and fourth gate electrode layers.

6. The semiconductor device according to claim 1, wherein a width of the oxide semiconductor layer is larger than a width of each of the source electrode layer and the drain electrode layer in a channel width direction of the channel formation region.

7. A semiconductor device comprising:
    a first gate electrode layer;
    a first insulating film over the first gate electrode layer;
    an oxide stack overlapping the first gate electrode layer with the first insulating film therebetween, wherein the oxide stack includes a first oxide layer, an oxide semiconductor layer comprising a channel formation region over the first oxide layer, and a second oxide layer over the oxide semiconductor layer;
    a source electrode layer and a drain electrode layer over and electrically connected to the oxide semiconductor layer;
    a second insulating film over the oxide stack, the source electrode layer, and the drain electrode layer;
    a second gate electrode layer overlapping the oxide stack with the second insulating film therebetween;

a third gate electrode layer over the second insulating film and overlapping a first end portion of the oxide stack; and a fourth gate electrode layer over the second insulating film and overlapping a second end portion of the oxide stack that is opposite the first end portion;

wherein the third gate electrode layer and the fourth gate electrode layer each extend in a direction that intersects with a channel length direction of the channel formation region.

8. The semiconductor device according to claim 7, further comprising a second source electrode layer and a second drain electrode layer respectively over and in contact with the source electrode layer and the drain electrode layer, wherein a distance between the second source electrode layer and the second drain electrode layer is shorter than a distance between the source electrode layer and the drain electrode layer.

9. The semiconductor device according to claim 7, wherein the oxide semiconductor layer, the first oxide layer, and the second oxide layer each comprise In, Zn, and a metal selected from Al, Ga, Ge, Y, Zr, Sn, La, Ce, and Hf, wherein an atomic ratio of the metal to In in each of the first oxide layer and the second oxide layer is greater than that in the oxide semiconductor layer.

10. The semiconductor device according to claim 7, wherein energy at a bottom of a conduction band of the oxide semiconductor layer is greater than that of each of the first oxide layer and the second oxide layer, and wherein energy at a top of a balance band of the oxide semiconductor layer is smaller than that of each of the first oxide layer and the second oxide layer.

11. The semiconductor device according to claim 7, wherein a carrier density of the oxide semiconductor layer is lower than $1 \times 10^{17}$ cm$^3$.

12. The semiconductor device according to claim 7, wherein the second gate electrode layer is configured to control drive of the semiconductor device, wherein the first, third and fourth gate electrode layers are configured to control threshold voltage of the semiconductor device, and wherein a potential supplied to the first gate electrode layer is different from that supplied to the third and fourth gate electrode layers.

13. The semiconductor device according to claim 7, wherein a width of the oxide stack is larger than a width of each of the source electrode layer and the drain electrode layer in a channel width direction of the channel formation region.

14. A semiconductor device comprising:

a first gate electrode layer;

a first insulating film over the first gate electrode layer;

an oxide stack overlapping the first gate electrode layer with the first insulating film therebetween, wherein the oxide stack includes an oxide semiconductor layer comprising a channel formation region;

a source electrode layer and a drain electrode layer over and electrically connected to the oxide semiconductor layer;

an oxide layer over the oxide stack, the source electrode layer, and the drain electrode layer;

a second insulating film over the oxide layer;

a second gate electrode layer overlapping the oxide stack with the second insulating film therebetween;

a third gate electrode layer over the second insulating film and overlapping a first end portion of the oxide stack; and a fourth gate electrode layer over the second insulating film and overlapping a second end portion of the oxide stack that is opposite the first end portion;

wherein the third gate electrode layer and the fourth gate electrode layer each extend in a direction that intersects with a channel length direction of the channel formation region.

15. The semiconductor device according to claim 14, further comprising a second source electrode layer and a second drain electrode layer respectively over and in contact with the source electrode layer and the drain electrode layer, wherein a distance between the second source electrode layer and the second drain electrode layer is shorter than a distance between the source electrode layer and the drain electrode layer.

16. The semiconductor device according to claim 14, wherein the oxide semiconductor layer and the oxide layer each comprise In, Zn, and a metal selected from Al, Ga, Ge, Y, Zr, Sn, La, Ce, and Hf, wherein an atomic ratio of the metal to In in the oxide layer is greater than that in the oxide semiconductor layer.

17. The semiconductor device according to claim 14, wherein a carrier density of the oxide semiconductor layer is lower than $1 \times 10^{17}$ cm$^3$.

18. The semiconductor device according to claim 14, wherein the second gate electrode layer is configured to control drive of the semiconductor device, wherein the first, third and fourth gate electrode layers are configured to control threshold voltage of the semiconductor device, and wherein a potential supplied to the first gate electrode layer is different from that supplied to the third and fourth gate electrode layers.

19. The semiconductor device according to claim 14, wherein a width of the oxide stack is larger than a width of each of the source electrode layer and the drain electrode layer in a channel width direction of the channel formation region.

20. The semiconductor device according to claim 14, wherein the oxide layer is in contact with the first end portion and the second end portion of the oxide stack.

\* \* \* \* \*

UNITED STATES PATENT AND TRADEMARK OFFICE
CERTIFICATE OF CORRECTION

PATENT NO. : 9,190,529 B2
APPLICATION NO. : 14/554208
DATED : November 17, 2015
INVENTOR(S) : Shunpei Yamazaki It is certified that error appears in the above-identified patent and that said Letters Patent is hereby corrected as shown below:

IN THE SPECIFICATION

Column 8, line 43, after "current" replace "noimalized" with --normalized--;

Column 10, line 49, after "component is" replace "totaled" with --formed--;

Column 11, line 62, after "and" replace "in" with --$m$--;

Column 17, line 26, after "118 is" replace "fondled" with --formed--;

Column 27, line 66-67, after "provided." delete "Further, a semiconductor device including the transistor can be provided.";

Column 33, line 29, after "transistor" replace "32002" with --3200_2--;

Column 33, line 62, after "transistor" replace "32002" with --3200_2--;

Column 33, line 64, after "cell" replace "3012" with --301_2--;

Column 34, line 19, after "layer" replace "3110b2" with --3110b_2--;

Column 34, line 32, after "layer" replace "3114a1" with --3114a_1--;

Column 34, line 67, replace "31142" with --3114_2--;

Column 35, line 9, after "layer" replace "31082" with --3108_2--;

Column 35, line 10, after "cell" replace "3012" with --301_2--;

Column 35, line 11, after "layer" replace "31082" with --3108_2--;

Column 35, line 27, after "and" replace "31142" with --3114_2--;

Column 35, line 48, after "layer" replace "31102" with --3110_2--; and

Column 36, line 7, after "transistor" replace "32002" with --3200_2--.

Signed and Sealed this
Twenty-sixth Day of April, 2016

Michelle K. Lee
*Director of the United States Patent and Trademark Office*